United States Patent
Ikemoto et al.

(10) Patent No.: US 12,438,261 B2
(45) Date of Patent: *Oct. 7, 2025

(54) ANTENNA ELEMENT, ELECTRONIC DEVICE, AND METHOD FOR MANUFACTURING ANTENNA ELEMENT

(71) Applicant: Murata Manufacturing Co., Ltd., Nagaokakyo (JP)

(72) Inventors: Nobuo Ikemoto, Nagaokakyo (JP); Kosuke Nishio, Nagaokakyo (JP); Kaoru Sudo, Nagaokakyo (JP); Keiichi Ichikawa, Nagaokakyo (JP); Nobuyuki Tenno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 138 days.

This patent is subject to a terminal disclaimer.

(21) Appl. No.: 18/381,671

(22) Filed: Oct. 19, 2023

(65) Prior Publication Data

US 2024/0047865 A1    Feb. 8, 2024

Related U.S. Application Data

(63) Continuation of application No. PCT/JP2022/015284, filed on Mar. 29, 2022.

(30) Foreign Application Priority Data

May 7, 2021 (JP) .................................. 2021-079044

(51) Int. Cl.
*H01Q 1/38* (2006.01)
(52) U.S. Cl.
CPC ..................................... *H01Q 1/38* (2013.01)

(58) Field of Classification Search
CPC .......... H01Q 1/38; H01Q 9/045; H01Q 13/10; H05K 3/46
See application file for complete search history.

(56) References Cited

U.S. PATENT DOCUMENTS

2002/0004180 A1*   1/2002  Hotta ...................... G03F 7/023
                                                              430/311
2022/0312597 A1    9/2022  Matsutomi et al.

FOREIGN PATENT DOCUMENTS

JP         2001308470 A      11/2001
JP         2004096259 A       3/2004
(Continued)

OTHER PUBLICATIONS

International Search Report in PCT/JP2022/015284, mailed Jun. 7, 2022, 3 pages.

(Continued)

*Primary Examiner* — David E Lotter
(74) *Attorney, Agent, or Firm* — Keating & Bennett, LLP

(57) ABSTRACT

An antenna element includes a first opening including an annular outer boundary in an antenna conductor layer. A first insulative substrate non-forming region is provided between an insulative substrate and the antenna conductor layer in an up-down direction. The insulative substrate does not exist in the first insulative substrate non-forming region. The outer boundary of the first opening overlaps one or more first insulative substrate non-forming regions and is not in contact with the insulative substrate. The first insulative substrate non-forming region is a first void, and a low dielectric constant material having a lower dielectric constant than that of a material of the insulative substrate or a high dielectric constant material having a higher dielectric constant than that of the material of the insulative substrate is provided in the first insulative substrate non-forming region.

20 Claims, 20 Drawing Sheets

(56) References Cited

FOREIGN PATENT DOCUMENTS

| | | |
|---|---|---|
| JP | 2006100450 A | 4/2006 |
| JP | 2006108702 A | 4/2006 |
| JP | 2014011769 A | 1/2014 |
| JP | 2021044475 A | 3/2021 |
| WO | 2015083216 A1 | 6/2015 |

OTHER PUBLICATIONS

Written Opinion in PCT/JP2022/015284, mailed Jun. 7, 2022, 4 pages.

* cited by examiner

Fig.5
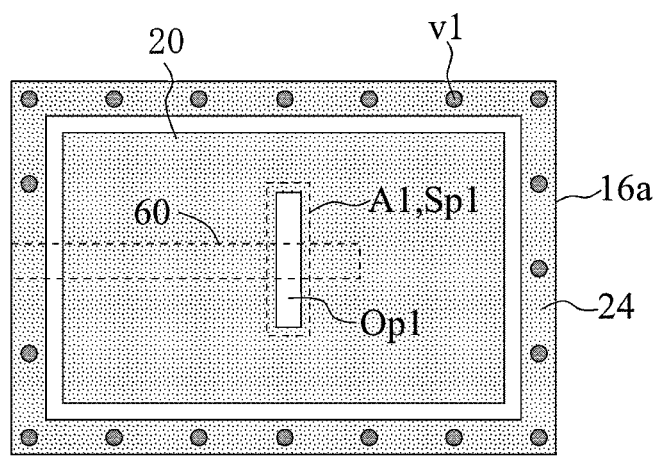
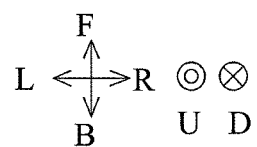

Fig.14
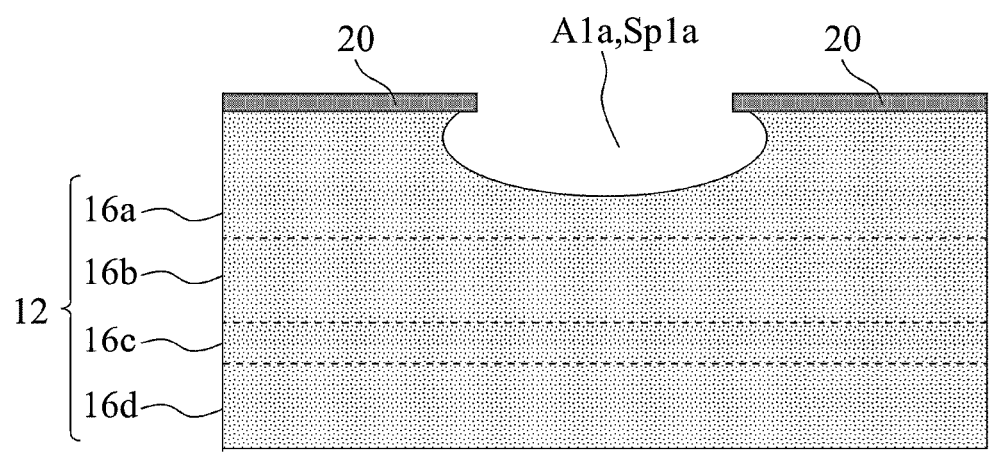
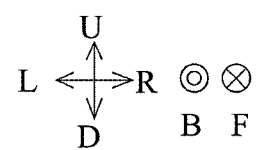

Fig.15
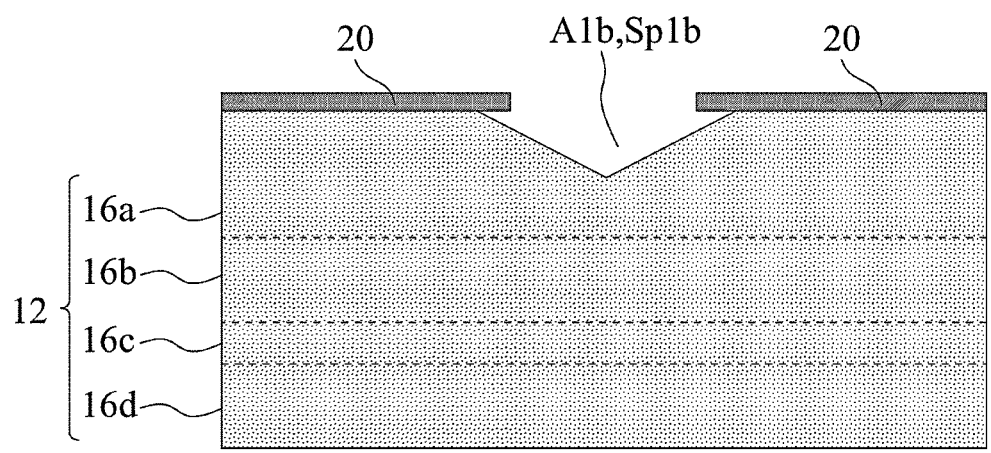
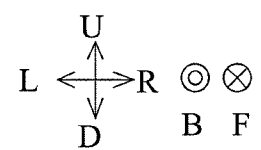

Fig.16
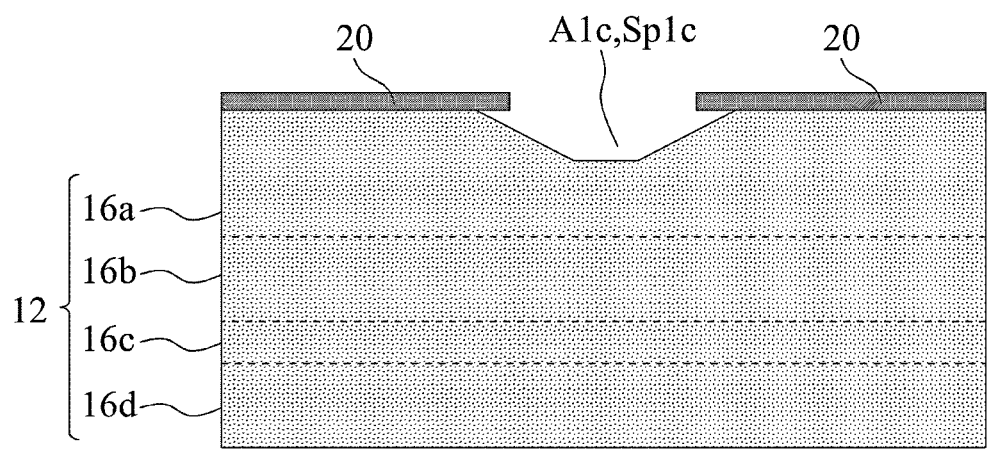
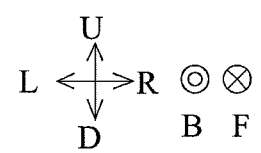

Fig.17
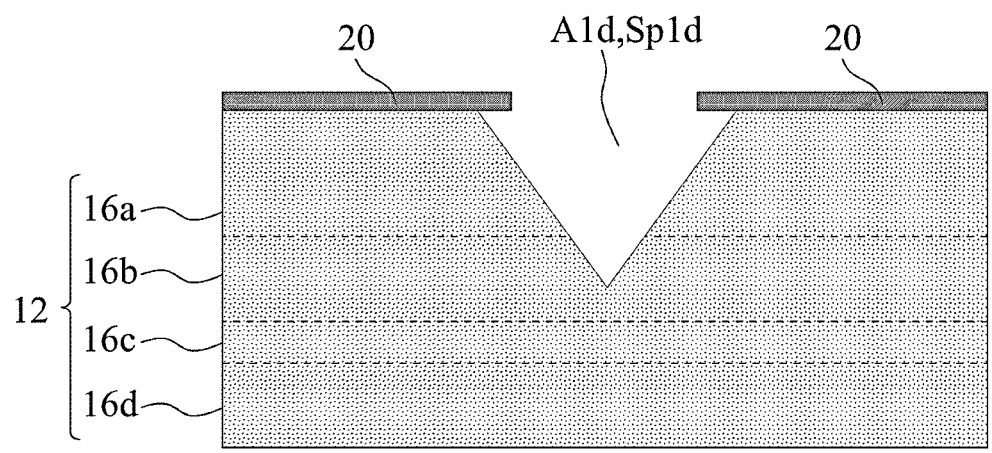
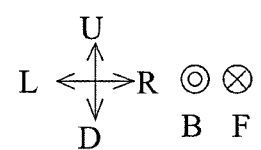

Fig.18
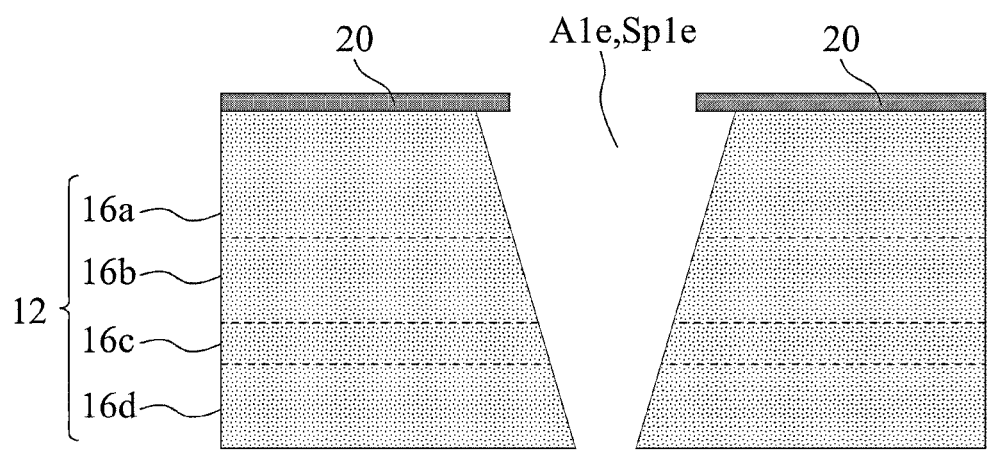
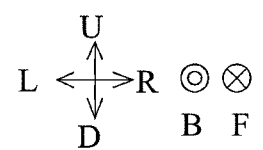

Fig.19
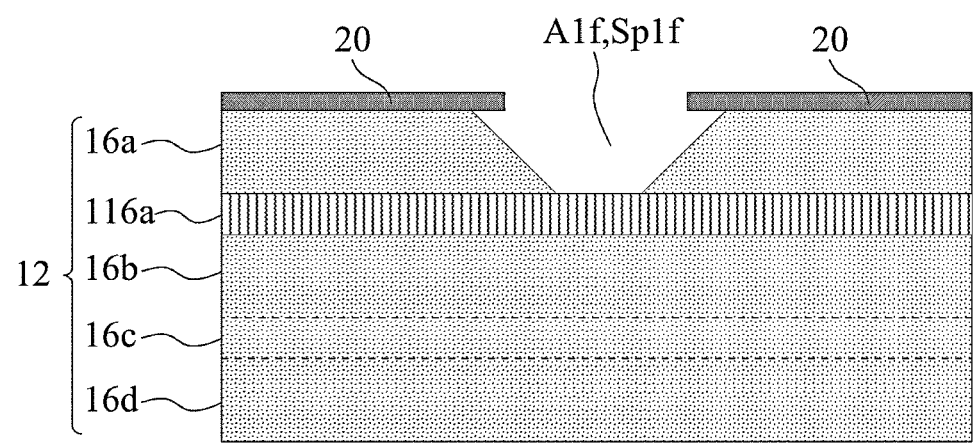
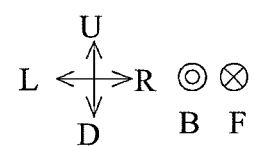

Fig.20
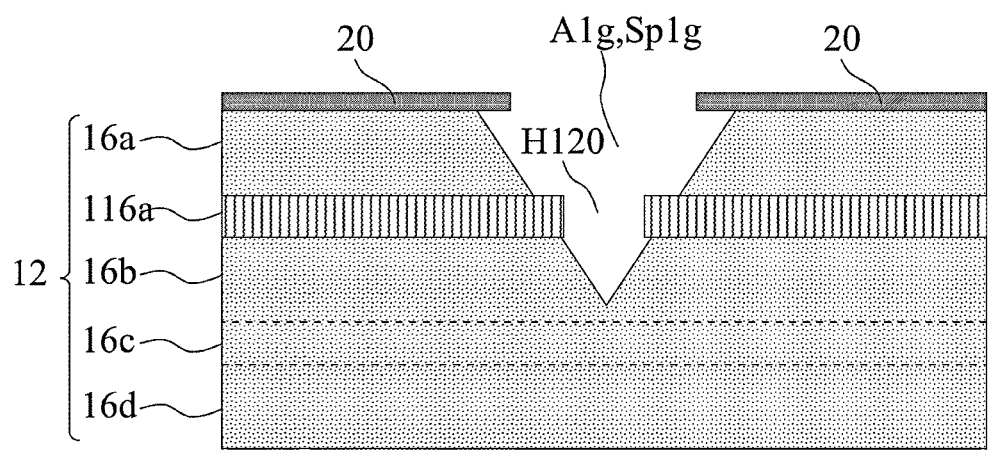
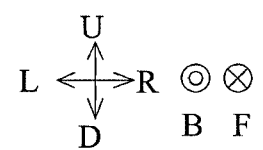

ANTENNA ELEMENT, ELECTRONIC DEVICE, AND METHOD FOR MANUFACTURING ANTENNA ELEMENT

CROSS REFERENCE TO RELATED APPLICATIONS

This application claims the benefit of priority to Japanese Patent Application No. 2021-079044 filed on May 7, 2021 and is a Continuation Application of PCT Application No. PCT/JP2022/015284 filed on Mar. 29, 2022. The entire contents of each application are hereby incorporated herein by reference.

BACKGROUND OF THE INVENTION

1. Field of the Invention

The present invention relates to an antenna element that includes an antenna conductor layer.

2. Description of the Related Art

As an invention relating to an antenna element of THE related art, for example, a microstrip antenna described in Japanese Unexamined Patent Application Publication No. 2004-096259 is known. This microstrip antenna includes a dielectric substrate, a quadrangular conductor, and a ground conductor. The dielectric substrate has an upper main surface and a lower main surface. The quadrangular conductor is provided on the upper main surface of the dielectric substrate. The ground conductor is provided on the lower main surface of the dielectric substrate. The quadrangular conductor overlaps the ground conductor when seen in the up-down direction. In such a microstrip antenna, the quadrangular conductor functions as an antenna.

Meanwhile, with respect to the microstrip antenna described in Japanese Unexamined Patent Application Publication No. 2004-096259, there is a demand to obtain a structure that allows high flexibility in design of the frequency of a radio-frequency signal that can be transmitted and received by the microstrip antenna.

SUMMARY OF THE INVENTION

Accordingly, preferred embodiments of the present invention provide antenna elements that each have a structure allowing high flexibility in design of a frequency of a radio-frequency signal that can be transmitted and received by the antenna element.

An antenna element according to a preferred embodiment of the present invention includes an insulative substrate including a first main surface and a second main surface arranged in an up-down direction, and an antenna conductor layer on the first main surface of the insulative substrate. One or more first openings including, when seen in the up-down direction, respective annular outer boundaries are provided in the antenna conductor layer. One or more first insulative substrate non-forming regions are positioned between the insulative substrate and the antenna conductor layer in the up-down direction. The insulative substrate does not exist in the one or more first insulative substrate non-forming regions. The outer boundaries of the one or more first openings respectively overlap, when seen in the up-down direction, the one or more first insulative substrate non-forming regions and are not in contact with the insulative substrate. The antenna element has a structure (A) in which the one or more first insulative substrate non-forming regions are first voids, or a structure (B) in which a low dielectric constant material having a lower dielectric constant than a dielectric constant of a material of the insulative substrate or a high dielectric constant material having a higher dielectric constant than the dielectric constant of the material of the insulative substrate is provided in the one or more first insulative substrate non-forming regions.

An antenna element according to a preferred embodiment of the present invention includes an insulative substrate including a first main surface and a second main surface arranged in an up-down direction, an antenna conductor layer on the first main surface of the insulative substrate, and a reference conductor layer on the second main surface of the insulative substrate. When seen in the up-down direction, the reference conductor layer overlaps the antenna conductor layer. One or more second openings that include, when seen in the up-down direction, respective annular outer boundaries are provided in the reference conductor layer. One or more second insulative substrate non-forming regions are positioned between the insulative substrate and the reference conductor layer in the up-down direction. The insulative substrate does not exist in the one or more second insulative substrate non-forming regions. The outer boundaries of the one or more second openings respectively overlap, when seen in the up-down direction, the one or more second insulative substrate non-forming regions and are not in contact with the insulative substrate. The antenna element has a structure (A) in which the one or more second insulative substrate non-forming regions are second voids, or a structure (D) in which a low dielectric constant material having a lower dielectric constant than a dielectric constant of a material of the insulative substrate or a high dielectric constant material having a higher dielectric constant than the dielectric constant of the material of the insulative substrate is provided in the one or more second insulative substrate non-forming regions.

A method for manufacturing an antenna element according to a preferred embodiment of the present invention includes forming an antenna conductor layer to form, on a first insulator layer, the antenna conductor layer in which one or more first openings having, when seen in an up-down direction, respective annular outer boundaries are provided, performing pressure bonding to form an insulative substrate by pressure bonding a plurality of insulator layers that include the first insulator layer, and performing first void forming to form one or more first voids that respectively include, when seen in the up-down direction, the one or more first openings by performing etching on the first insulator layer with the antenna conductor layer used as a mask.

A method for manufacturing an antenna element according to a preferred embodiment of the present invention includes forming a reference conductor layer to form, on a second insulator layer, the reference conductor layer in which one or more second openings having, when seen in an up-down direction, respective annular outer boundaries are provided, performing pressure bonding to form an insulative substrate by pressure bonding a plurality of insulator layers that include a first insulator layer on which an antenna conductor layer is provided and the second insulator layer, and performing second void forming to form one or more second voids respectively including, when seen in the up-down direction, the one or more second openings by performing etching on the second insulator layer with the reference conductor layer used as a mask.

With antenna elements, electronic devices, and methods for manufacturing antenna elements according to preferred embodiments of the present invention, a structure allowing high flexibility in design of the frequency of the radio-frequency signal that can be transmitted and received by the antenna element is obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a top view of an insulator layer 16a of an antenna element 10b according to a preferred embodiment of the present invention.

FIG. 14 is a sectional view of a void Sp1a.
FIG. 15 is a sectional view of a void Sp1b.
FIG. 16 is a sectional view of a void Sp1c.
FIG. 17 is a sectional view of a void Sp1d.
FIG. 18 is a sectional view of a void Sp1e.
FIG. 19 is a sectional view of a void Sp1f.
FIG. 20 is a sectional view of a void Sp1g.

DETAILED DESCRIPTION OF THE PREFERRED EMBODIMENTS

Preferred Embodiments

Structure of Antenna Element

Figure 1:
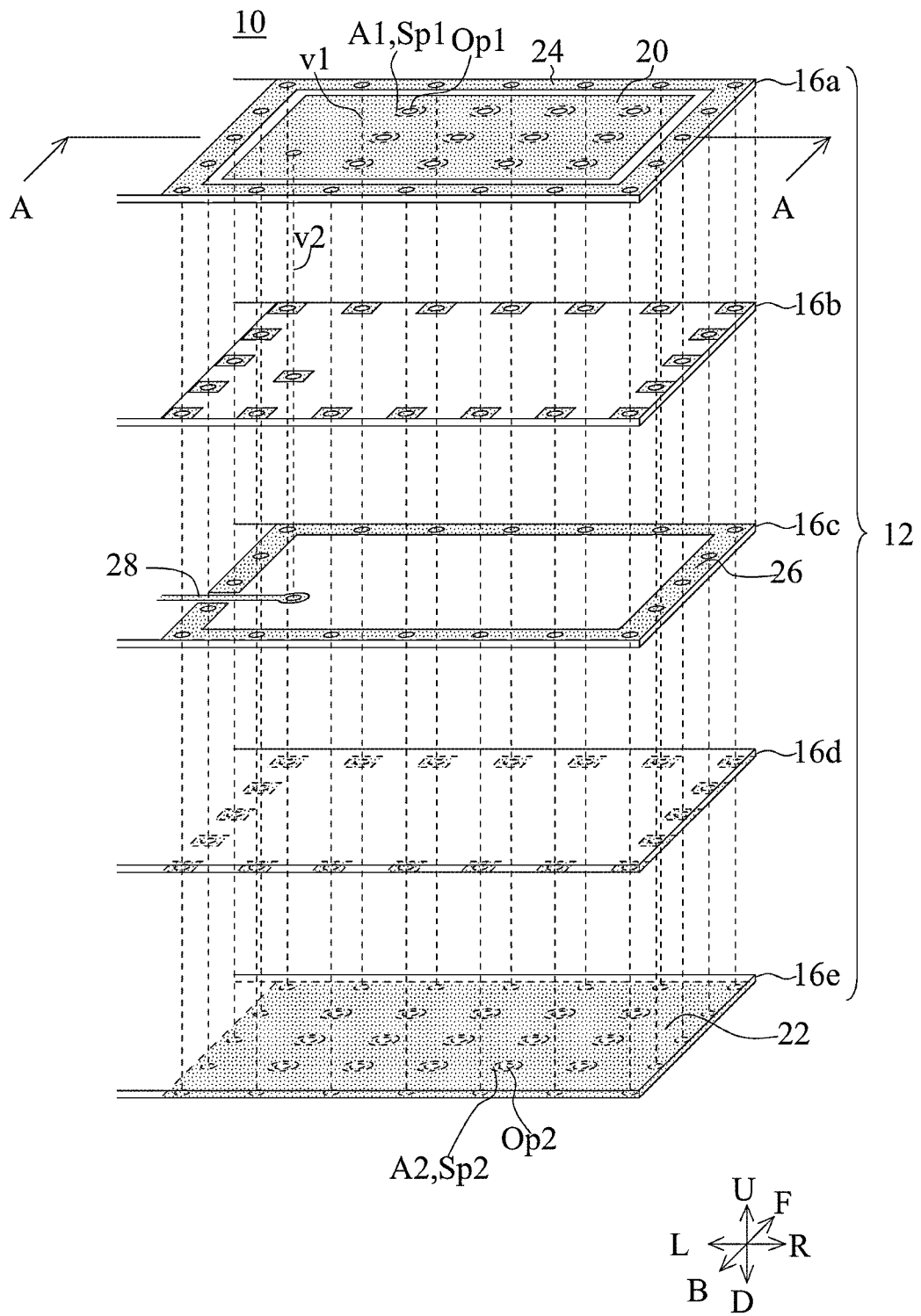
FIG. 1 is an exploded perspective view of an antenna element 10 according to a preferred embodiment of the present invention.
Figure 2:
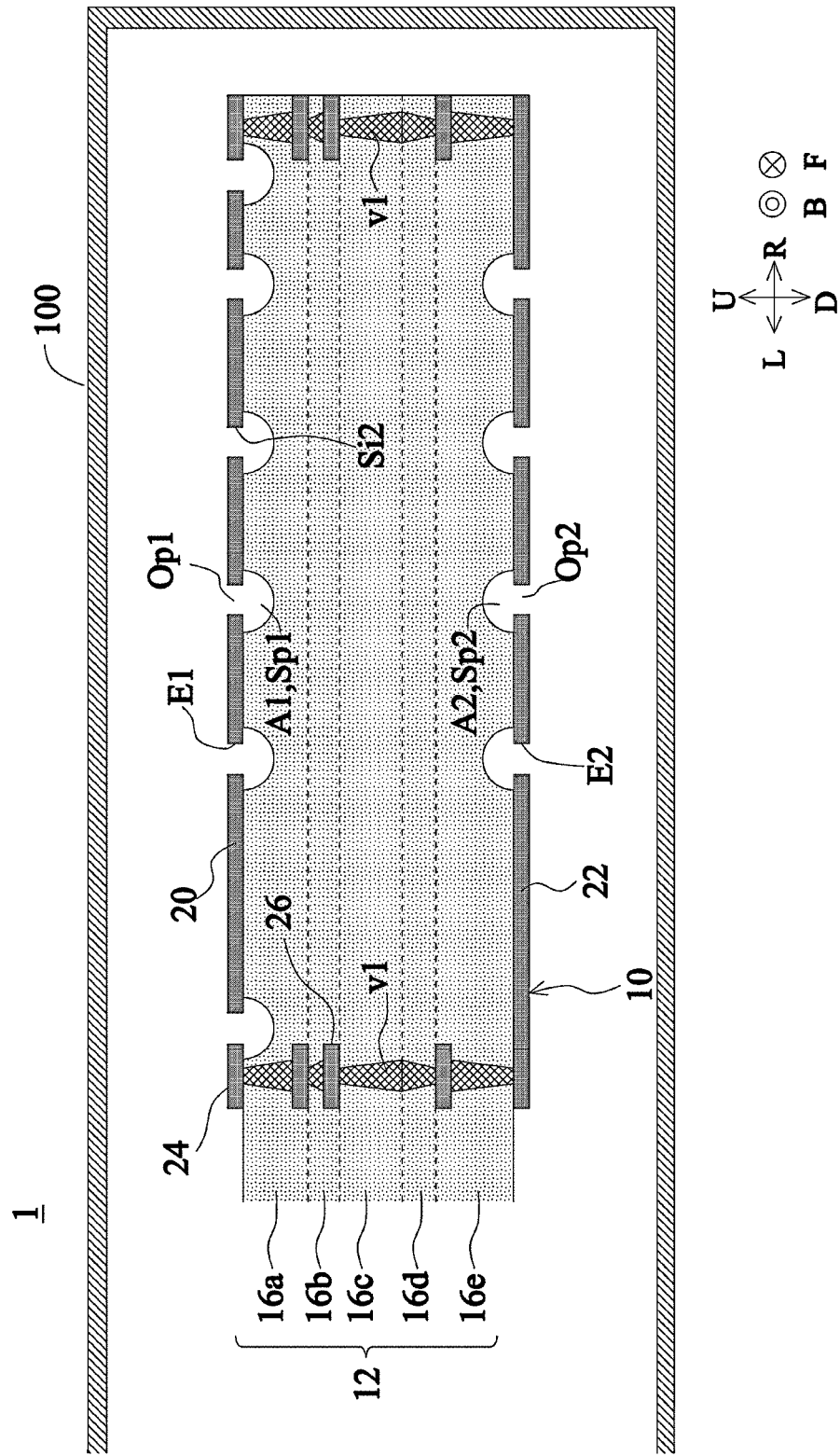
FIG. 2 is a sectional view taken along line A-A of FIG. 1.

Hereinafter, a structure of an antenna element 10 according to a preferred embodiment of the present invention is described with reference to the drawings. FIG. 1 is an exploded perspective view of the antenna element 10. In FIG. 1, only the following components are denoted by the reference numerals. That is, a representative interlayer connection conductor v1, a representative first opening Op1, a representative second opening Op2, a representative first insulative substrate non-forming region A1, a representative second insulative substrate non-forming region A2, a representative first void Sp1, and a representative second void Sp2 out of a plurality of interlayer connection conductors v1, a plurality of first openings Op1, a plurality of second openings Op2, a plurality of first insulative substrate non-forming regions A1, a plurality of second insulative substrate non-forming regions A2, a plurality of first voids Sp1, and a plurality of second voids Sp2. FIG. 2 is a sectional view of an electronic device 1 that includes the antenna element 10. FIG. 2 is a sectional view taken along line A-A of FIG. 1. However, a housing 100 not illustrated in FIG. 1 is illustrated in FIG. 2.

Herein, directions are defined as follows. A direction in which normal lines of an upper main surface and a lower main surface of an insulative substrate 12 of the antenna element 10 extend is defined as an up-down direction. The up-down direction is the same as a lamination direction of the insulative substrate 12. Furthermore, a direction in which the long side of an antenna conductor layer 20 of the antenna element 10 extends is defined as a left-right direction. A direction in which the narrow side of the antenna conductor layer 20 of the antenna element 10 extends is defined as a front-back direction. The up-down direction is perpendicular or substantially perpendicular to the front-back direction. The left-right direction is perpendicular or substantially perpendicular to the up-down direction and the front-back direction.

Hereinafter, an X is a component or a member of the antenna element 10. Herein, unless otherwise specified, portions of the X are defined as follows. A front portion of an X means a front half of the X. A back portion of an X means a back half of the X. A left portion of an X means a left half of the X. A right portion of an X means a right half of the X. An upper portion of an X means an upper half of the X. A lower portion of an X means a lower half of the X. A front end of an X means an end of the X in the front direction. A back end of an X means an end of the X in the back direction. A left end of an X means an end of the X in the left direction. A right end of an X means an end of the X in the right direction. An upper end of an X means an end of the X in the upper direction. A lower end of an X means an end of the X in the lower direction. A front end portion of an X means the front end of the X and the proximity of the front end of the X. A back end portion of an X means the back end of the X and the proximity of the back end of the X. A left end portion of an X means the left end of the X and the proximity of the left end of the X. A right end portion of an X means the right end of the X and the proximity of the right end of the X. An upper end portion of an X means the upper end of the X and the proximity of the upper end of the X. A lower end portion of an X means the lower end of the X and the proximity of the lower end of the X.

First, the structure of the antenna element 10 is described with reference to FIG. 1. As illustrated in FIG. 1, the antenna element 10 includes the insulative substrate 12, the antenna conductor layer 20, reference conductor layers 22, 24, and 26, a signal conductor layer 28, the plurality of interlayer connection conductors v1, and an interlayer connection conductor v2.

The insulative substrate 12 has a plate shape. Accordingly, the insulative substrate 12 includes the upper main surface (a first main surface) and the lower main surface (a second main surface) arranged in the up-down direction. The upper main surface and the lower main surface of the insulative substrate 12 has a rectangular or substantially rectangular shape including the long side extending in the left-right direction. Accordingly, the length of the insulative substrate 12 in the left-right direction is greater than the length of the insulative substrate 12 in the front-back direction.

As illustrated in FIG. 1, the insulative substrate 12 includes insulator layers 16a to 16e. The insulative substrate 12 has a structure in which the insulator layers 16a to 16e are laminated together in the up-down direction. The insulator layers 16a to 16e are arranged in this order from upper to lower. When seen in the up-down direction, the insulator layers 16a to 16e have the same or substantially the same rectangular or substantially rectangular shape as that of the insulative substrate 12. The insulator layers 16a to 16e are flexible dielectric sheets. The material of the insulative substrate 12 is, for example, thermoplastic resin. Examples of the thermoplastic resin include thermoplastic resins such as, for example, liquid crystal polymer and polytetrafluoroethylene (PTFE). The material of the insulative substrate 12 may be, for example, polyimide. The insulative substrate 12 has a flexibility. Thus, the antenna element 10 may be bent in use. The sentence "the antenna element 10 is bent" means that the antenna element 10 is deformed and bent due to application of an external force to the antenna element 10. The deformation may be elastic deformation, plastic deformation, or elastic deformation and plastic deformation.

The antenna conductor layer 20 is provided on the upper main surface (a first main surface) of the insulative substrate 12. According to the present preferred embodiment, the antenna conductor layer 20 is provided on the upper main surface of the insulator layer 16a. When seen in the up-down direction, the antenna conductor layer 20 has a rectangular or substantially rectangular shape including the long side extending in the left-right direction. The antenna conductor layer 20 resonates at both of the narrow side extending in the front-back direction and also at the long side extending in the left-right direction. Thus, the length of the narrow side extending in the front-back direction of the antenna conductor layer 20 and the length of the long side extending in the left-right direction of the antenna conductor layer 20 are each about half a corresponding one of the wavelengths of radio-frequency signals to be transmitted and received by the antenna conductor layer 20. The length of the wavelength of the radio-frequency signal to be transmitted and received by the antenna conductor layer 20 is a wavelength for which a wavelength shortening effect due to the dielectric constant of the insulative substrate 12 is considered. The antenna conductor layer 20 radiates the radio-frequency signal as an electromagnetic wave.

Also, the antenna conductor layer 20 receives the radio-frequency signal of the electromagnetic wave.

The signal conductor layer 28 is provided in the insulative substrate 12. According to the present preferred embodiment, the signal conductor layer 28 is provided on an upper main surface of the insulator layer 16c. The signal conductor layer 28 has a linear shape extending in the left-right direction. When seen in the up-down direction, a right end portion of the signal conductor layer 28 overlaps the antenna conductor layer 20. The signal conductor layer 28 transmits the radio-frequency signal.

The interlayer connection conductor v2 electrically connects the antenna conductor layer 20 and the signal conductor layer 28 to each other. In more detail, the interlayer connection conductor v2 extends through the insulator layers 16a and 16b in the up-down direction. An upper end of the interlayer connection conductor v2 is connected to the antenna conductor layer 20. The position of the antenna conductor layer 20 to which the interlayer connection conductor v2 is connected is a power feeding point of the radio-frequency signal. A lower end of the interlayer connection conductor v2 is connected to the right end portion of the signal conductor layer 28.

The reference conductor layer 22 is provided on the lower main surface (the second main surface) of the insulative substrate 12. Accordingly, the reference conductor layer 22 provided on the insulative substrate 12 is provided below the antenna conductor layer 20. According to the present preferred embodiment, the reference conductor layer 22 is provided on a lower main surface of the insulator layer 16e. When seen in the up-down direction, the reference conductor layer 22 overlaps the antenna conductor layer 20. When seen in the up-down direction, the reference conductor layer 22 has a rectangular or substantially rectangular shape including the long side extending in the left-right direction.

The reference conductor layer 24 is provided on the insulative substrate 12. According to the present preferred embodiment, the reference conductor layer 24 is provided on the upper main surface of the insulator layer 16a. When seen in the up-down direction, the reference conductor layer 24 has a rectangular or substantially rectangular frame shape. Thus, when seen in the up-down direction, the reference conductor layer 24 surrounds a region around the antenna conductor layer 20. However, in order to avoid short circuiting between the antenna conductor layer 20 and the reference conductor layer 24, the antenna conductor layer 20 and the reference conductor layer 24 are separated from each other. Furthermore, when seen in the up-down direction, an outer boundary of the reference conductor layer 24 is coincident or substantially coincident with an outer boundary of the reference conductor layer 22.

The reference conductor layer 26 is provided in the insulative substrate 12. According to the present preferred embodiment, the reference conductor layer 26 is provided on the upper main surface of the insulator layer 16c. However, the shape of the reference conductor layer 26 is the same or substantially the same as the shape of the reference conductor layer 24. However, in order to avoid short circuiting between the reference conductor layer 26 and the signal conductor layer 28, the reference conductor layer 26 and the signal conductor layer 28 are spaced from each other.

The plurality of interlayer connection conductors v1 electrically connect the reference conductor layer 22, the reference conductor layer 24, and the reference conductor layer 26 to each other. In more detail, the plurality of interlayer connection conductors v1 extend through the insulator layers 16a to 16e in the up-down direction. Upper ends of the plurality of interlayer connection conductors v1 are connected to the reference conductor layer 24. Intermediate portions of the plurality of interlayer connection conductors v1 are connected to the reference conductor layer 26. Lower ends of the plurality of interlayer connection conductors v1 are connected to the reference conductor layer 22. When seen in the up-down direction, the plurality of interlayer connection conductors v1 are arranged along the reference conductor layer 24. That is, when seen in the up-down direction, the plurality of interlayer connection conductors v1 are arranged so as to surround the antenna conductor layer 20.

The antenna conductor layer 20, the reference conductor layers 22, 24, and 26, and the signal conductor layer 28 as described above are formed by, for example, etching metal foils provided on upper main surfaces or lower main surfaces of the insulator layers 16a to 16e. The metal foils are, for example, copper foils. Furthermore, the interlayer connection conductors v1 and v2 are, for example, via hole conductors. The via hole conductors are created by, for example, forming through holes in the insulator layers 16a to 16e, filling the through holes with electrically conductive paste, and solidifying the electrically conductive paste by heat. The interlayer connection conductors v1 and v2 may be, for example, through hole conductors. The through hole conductors are created by, for example, forming through holes that extend through a subset or all of the insulator layers 16a to 16e and plating the through holes.

Next, the plurality of first openings Op1, the plurality of first insulative substrate non-forming regions A1, and the plurality of first voids Sp1 are described. The plurality of first openings Op1 are provided in the antenna conductor layer 20. When seen in the up-down direction, the plurality of first openings Op1 are disposed in a matrix configuration. When seen in the up-down direction, the plurality of first openings Op1 each have an annular outer boundary E1. According to the present preferred embodiment, when seen in the up-down direction, the plurality of first openings Op1 each include a circular or substantially circular outer boundary E1. However, the annular shape is not limited to a circular shape, and may be, for example, a rectangular or substantially rectangular shape or a triangular or substantially triangular shape. Accordingly, the first openings Op1 do not include a cutout. The cutout is a region surrounded by an outer boundary not having an annular shape. The outer boundary of the cutout is a portion of an outer boundary of the antenna conductor layer 20. The antenna conductor layer 20 does not exist in the first openings Op1. The distance between the plurality of first openings Op1 adjacent to each other is, for example, smaller than or equal to about one quarter of the wavelength of the radio-frequency signal to be transmitted and received by the antenna conductor layer 20.

As illustrated in FIG. 2, the plurality of first insulative substrate non-forming regions A1 are provided by recessing portions of the upper main surface of the insulative substrate 12 in the lower direction. The plurality of first insulative substrate non-forming regions A1 are positioned between the insulative substrate 12 and the antenna conductor layer 20 in the up-down direction. The insulative substrate 12 does not exist in the plurality of first insulative substrate non-forming regions A1. According to the present preferred embodiment, the plurality of first insulative substrate non-forming regions A1 are the first voids Sp1.

When seen in the up-down direction, the plurality of first insulative substrate non-forming regions A1 are disposed in a matrix configuration so as to correspond to the plurality of first openings Op1. When seen in the up-down direction, the plurality of first insulative substrate non-forming regions A1 each include an annular outer boundary. According to the present preferred embodiment, when seen in the up-down direction, the plurality of first insulative substrate non-forming regions A1 each include, for example, a circular or substantially circular outer boundary. When seen in the up-down direction, the plurality of first insulative substrate non-forming regions A1 each include a corresponding one of the plurality of first openings Op1. That is, when seen in the up-down direction, each of the plurality of first openings Op1 does not extend off a corresponding one of the plurality of first insulative substrate non-forming regions A1. Thus, the diameter of the first insulative substrate non-forming regions A1 is greater than the diameter of the first openings Op1. Furthermore, the first insulative substrate non-forming regions A1 each have, for example, a hemispherical shape.

Since the first insulative substrate non-forming regions A1 have the above-described structure, when seen in the up-down direction, the outer boundary E1 of each of the plurality of first openings Op1 overlaps a corresponding one of the plurality of first insulative substrate non-forming regions A1, and accordingly, is not in contact with the insulative substrate 12. That is, the corresponding one of the plurality of first insulative substrate non-forming regions A1 is positioned below the outer boundary E1 of each of the plurality of first openings Op1.

Next, the plurality of second openings Op2, the plurality of second insulative substrate non-forming regions A2, and the plurality of second voids Sp2 are described. The plurality of second openings Op2, the plurality of second insulative substrate non-forming regions A2, and the plurality of second voids Sp2 are structured so as to be symmetrical or substantially symmetrical with the plurality of first openings Op1, the plurality of first insulative substrate non-forming regions A1, and the plurality of first voids Sp1 in the up-down direction.

The plurality of second openings Op2 are provided in the reference conductor layer 22. When seen in the up-down direction, the plurality of second openings Op2 are disposed in a matrix configuration. When seen in the up-down direction, the plurality of second openings Op2 each include an annular outer boundary E2. According to the present preferred embodiment, when seen in the up-down direction, the plurality of second openings Op2 each include, for example, the circular or substantially circular outer boundary E2. However, the annular shape is not limited to a circular shape, and may be, for example, a rectangular or substantially rectangular shape or a triangular or substantially triangular shape. The reference conductor layer 22 does not exist in the second openings Op2.

As illustrated in FIG. 2, the plurality of second insulative substrate non-forming regions A2 are provided by recessing portions of the lower main surface of the insulative substrate 12 in the upper direction. The plurality of second insulative substrate non-forming regions A2 are positioned between the insulative substrate 12 and the reference conductor layer 22 in the up-down direction. The insulative substrate 12 does not exist in the plurality of second insulative substrate non-forming regions A2. According to the present preferred embodiment, the plurality of second insulative substrate non-forming regions A2 are second voids Sp2.

When seen in the up-down direction, the plurality of second insulative substrate non-forming regions A2 are disposed in a matrix configuration so as to correspond to the plurality of second openings Op2. When seen in the up-down direction, the plurality of second insulative substrate non-forming regions A2 each include an annular outer boundary. According to the present preferred embodiment, when seen in the up-down direction, the plurality of second insulative substrate non-forming regions A2 each include, for example, a circular or substantially circular outer boundary. When seen in the up-down direction, the plurality of second insulative substrate non-forming regions A2 each include a corresponding one of the plurality of second openings Op2. Furthermore, the second insulative substrate non-forming regions A2 each have, for example, a hemispherical shape. Since the second insulative substrate non-forming regions A2 have the above-described structure, when seen in the up-down direction, the outer boundary E2 of each of the plurality of second openings Op2 overlaps a corresponding one of the plurality of second insulative substrate non-forming regions A2 and is not in contact with the insulative substrate 12. That is, the corresponding one of the plurality of second insulative substrate non-forming regions A2 is positioned below the outer boundary E2 of each of the plurality of second openings Op2.

As illustrated in FIG. 2, the electronic device 1 includes the antenna element 10 and the housing 100. The antenna element 10 is accommodated in the housing 100. The electronic device 1 is, for example, a mobile wireless communication terminal such as a smartphone.

Method for Manufacturing Antenna Element

Figure 3:
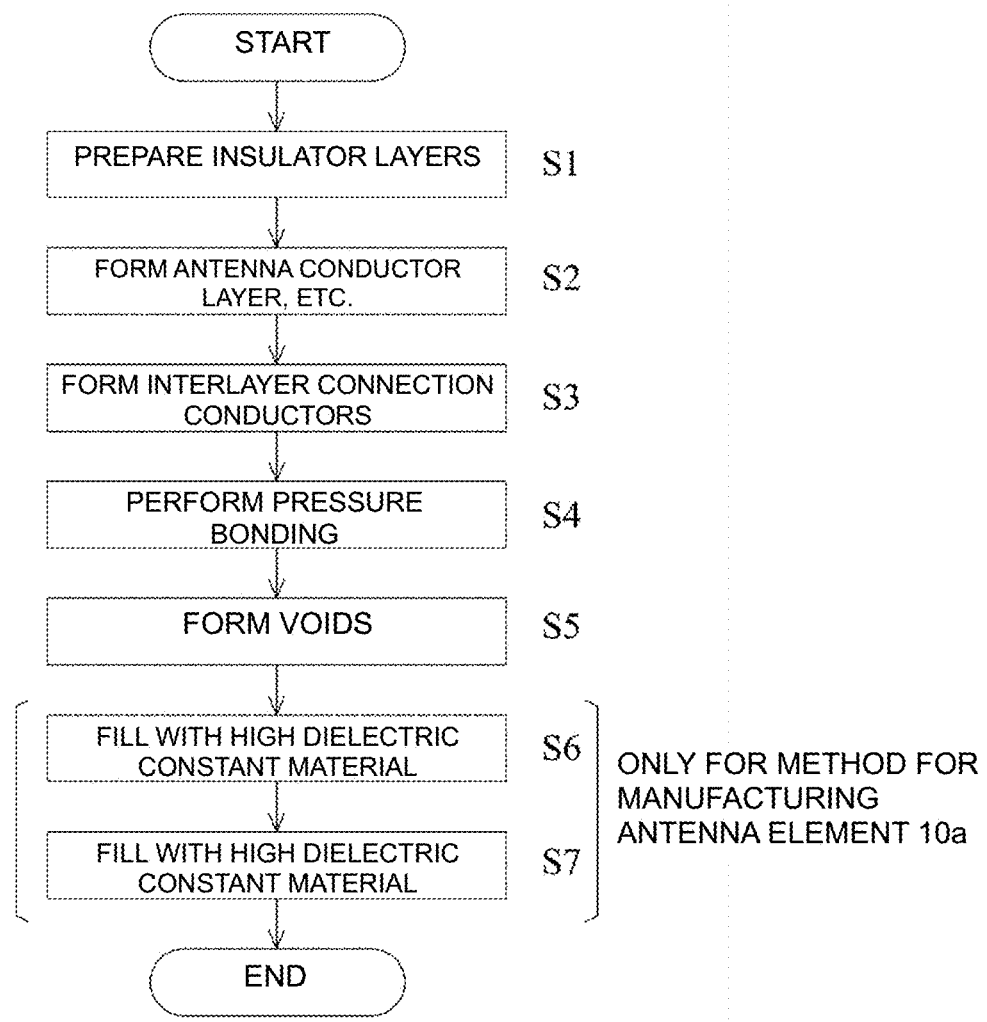
FIG. 3 is a flowchart illustrating manufacturing steps of an antenna element 10 according to a preferred embodiment of the present invention.

Hereinafter, a method for manufacturing the antenna element 10 according to a preferred embodiment of the present invention is described with reference to the drawings. FIG. 3 is a flowchart illustrating manufacturing steps of the antenna element 10.

First, the insulator layers 16a to 16c to each of which the metal foil is pasted to the upper main surface are prepared. Similarly, the insulator layers 16d and 16e to each of which the metal foil is pasted to the lower main surface are prepared (step S1).

Next, masks are formed on the metal foils and etching is performed so as to form the antenna conductor layer 20, the reference conductor layers 22, 24, and 26, and the signal conductor layer 28 (step S2). In step S2, the antenna conductor layer 20 in which the plurality of first openings Op1 each including, when seen in the up-down direction, the annular outer boundary are provided is formed on the insulator layer 16a (a first insulator layer) (an antenna conductor layer manufacturing step). Also in step S2, the reference conductor layer 22 in which the plurality of second openings Op2 each including, when seen in the up-down direction, the annular outer boundary are provided is formed on the insulator layer 16e (a second insulator layer) (a reference conductor layer manufacturing step).

Next, the plurality of interlayer connection conductors v1 and the interlayer connection conductor v2 are formed in the insulator layers 16a to 16e (step S3). Specifically, for example, a laser beam is radiated to the insulator layers 16a to 16e so as to form a plurality of through holes. After that, the plurality of through holes are filled with electrically conductive paste.

Next, the insulator layers 16a to 16e are subjected to pressure bonding so as to form the insulative substrate 12 (step S4; a pressure bonding step). The antenna conductor layer 20 is provided on the insulator layer 16a (the first insulator layer). The reference conductor layer 22 is provided on the insulator layer 16e (the second insulator layer). In the pressure bonding step, the insulator layers 16a to 16e are heated while being pressurized in the up-down direction. Thus, the insulator layers 16a to 16e are softened, and the insulator layers 16a to 16e are integrated together. Furthermore, the electrically conductive paste is solidified by heat, and the plurality of interlayer connection conductors v1 and the interlayer connection conductor v2 are formed.

Next, the plurality of first voids Sp1 and the plurality of second voids Sp2 are respectively formed in the insulator layers 16a and 16e (step S5). Specifically, the insulator layer 16a (the first insulator layer) is etched with the antenna conductor layer 20 used as a mask, thus forming the plurality of first voids Sp1 each including a corresponding one of the plurality of first openings Op1 when seen in the up-down direction (a first void forming step). Furthermore, the insulator layer 16e (the second insulator layer) is etched with the reference conductor layer 22 used as a mask, thus forming the plurality of second voids Sp2 each containing a corresponding one of the plurality of second openings Op2 when seen in the up-down direction (a second void forming step). Through the above-described steps, the antenna element 10 is completed.

Advantageous Effects

According to the antenna element 10, a structure enabling high flexibility in design of the frequency of the radio-frequency signal that can be transmitted and received by the antenna element 10 can be obtained. In more detail, when seen in the up-down direction, the outer boundary E1 of each of the plurality of first openings Op1 overlaps a corresponding one of the plurality of first insulative substrate non-forming regions A1 and is not in contact with the insulative substrate 12. In addition, the plurality of first insulative substrate non-forming regions A1 are the first voids Sp1. This reduces the dielectric constant of the proximity of the antenna conductor layer 20. This increases the wavelength of the radio-frequency signal to be transmitted through the antenna conductor layer 20. As a result, the frequency of the radio-frequency signal that can be transmitted and received by the antenna element 10 is reduced. Thus, when the number and the size of the first voids Sp1 are adjusted, the frequency of the radio-frequency signal that can be transmitted and received by the antenna element 10 can be adjusted. From the above description, according to the antenna element 10, the structure enabling high flexibility in design of the frequency of the radio-frequency signal that can be transmitted and received by the antenna element 10 can be obtained.

Also for the following reason, according to the antenna element 10, the structure enabling high flexibility in design of the frequency of the radio-frequency signal that can be transmitted and received by the antenna element 10 can be obtained. In more detail, when seen in the up-down direction, the outer boundary E2 of each of the plurality of second openings Op2 overlaps a corresponding one of the plurality of second insulative substrate non-forming regions A2 and is not in contact with the insulative substrate 12. In addition, the plurality of second insulative substrate non-forming regions A2 are the second voids Sp2. This reduces the dielectric constant between the antenna conductor layer 20 and the reference conductor layer 22. This increases the wavelength of the radio-frequency signal to be transmitted through the antenna conductor layer 20. As a result, the frequency of the radio-frequency signal that can be transmitted and received by the antenna element 10 is reduced. Thus, when the number and the size of the second voids Sp2 are adjusted, the frequency of the radio-frequency signal that can be transmitted and received by the antenna element 10 can be adjusted. From the above description, according to the antenna element 10 of the present preferred embodiment, the structure enabling high flexibility in design of the frequency of the radio-frequency signal that can be transmitted and received by the antenna element 10 can be obtained.

According to the antenna element 10 of the present preferred embodiment, the thickness of the antenna element 10 can be reduced. In more detail, the plurality of first insulative substrate non-forming regions A1 are each positioned between the insulative substrate 12 and the antenna conductor layer 20 in the up-down direction. The plurality of second insulative substrate non-forming regions A2 are each positioned between the insulative substrate 12 and the reference conductor layer 22 in the up-down direction. The plurality of first insulative substrate non-forming regions A1 are the first voids Sp1, and the plurality of second insulative substrate non-forming regions A2 are the second voids Sp2. This reduces the dielectric constant of a region between the antenna conductor layer 20 and the reference conductor layer 22. Accordingly, in order to form the capacitance of the design value between the antenna conductor layer 20 and the reference conductor layer 22, it is sufficient that the distance between the antenna conductor layer 20 and the reference conductor layer 22 is reduced. Thus, the thickness of the antenna element can be reduced.

According to the antenna element 10 of the present preferred embodiment, the antenna element 10 can be easily bent. In more detail, in the antenna element 10, the plurality of first voids Sp1 and the plurality of second voids Sp2 are provided in the insulative substrate 12. Thus, the antenna element 10 is easily deformed. Furthermore, since the thickness of the antenna element 10 is reduced as described above, the antenna element 10 is more easily deformed. As a result, according to the antenna element 10, the antenna element 10 can be easily bent.

According to the antenna element 10, the radiation efficiency of the antenna element 10 can be improved. In more detail, as described above, the dielectric constant of the proximity of the antenna conductor layer 20 is reduced, and accordingly, the wavelength of the radio-frequency signal transmitted through the antenna conductor layer 20 is increased. Accordingly, in order to resonate the radio-frequency signal in the antenna conductor layer 20, the size of the antenna conductor layer 20 may be increased. When the size of the antenna conductor layer 20 is increased, the radiation efficiency of the antenna element 10 is improved. The distance between the plurality of first openings Op1 adjacent to each other is about one quarter of the wavelength of the radio-frequency signal to be transmitted and received by the antenna conductor layer 20. Thus, resonation between the voids in the frequency band of the radio-frequency signal to be transmitted and received by the antenna conductor layer 20 can be reduced or prevented, and accordingly, reduction of the radiation efficiency can be prevented.

According to the method for manufacturing the antenna element 10 according to the present preferred embodiment, the plurality of first voids Sp1 and the plurality of second voids Sp2 can be easily formed. In more detail, the insulator layer 16a (the first insulator layer) is etched with the antenna conductor layer 20 used as a mask, thus forming the plurality of first voids Sp1 each including a corresponding one of the plurality of first openings Op1 when seen in the up-down direction (the first void forming step). Furthermore, the insulator layer 16e (the second insulator layer) is etched with the reference conductor layer 22 used as a mask, thus forming the plurality of second voids Sp2 each containing a corresponding one of the plurality of second openings Op2 when seen in the up-down direction (the second void forming step). When the antenna conductor layer 20 and the reference conductor layer 22 are used as the masks as described above, formation of a new mask is not required to form the plurality of first voids Sp1 and the plurality of second voids Sp2. As a result, according to the method for manufacturing the antenna element 10 of the present preferred embodiment, the plurality of first voids Sp1 and the plurality of second voids Sp2 can be easily formed.

Since the material of the insulative substrate 12 is, for example, thermoplastic resin, use of a bond layer formed of a different material from the material of the thermoplastic resin is not required to join the insulator layers 16a to 16e. Thus, the insulative substrate 12 can be easily formed by heat pressure bonding. Furthermore, the insulative substrate 12 can be easily subjected to plastic deformation.

First Variant

Figure 4:
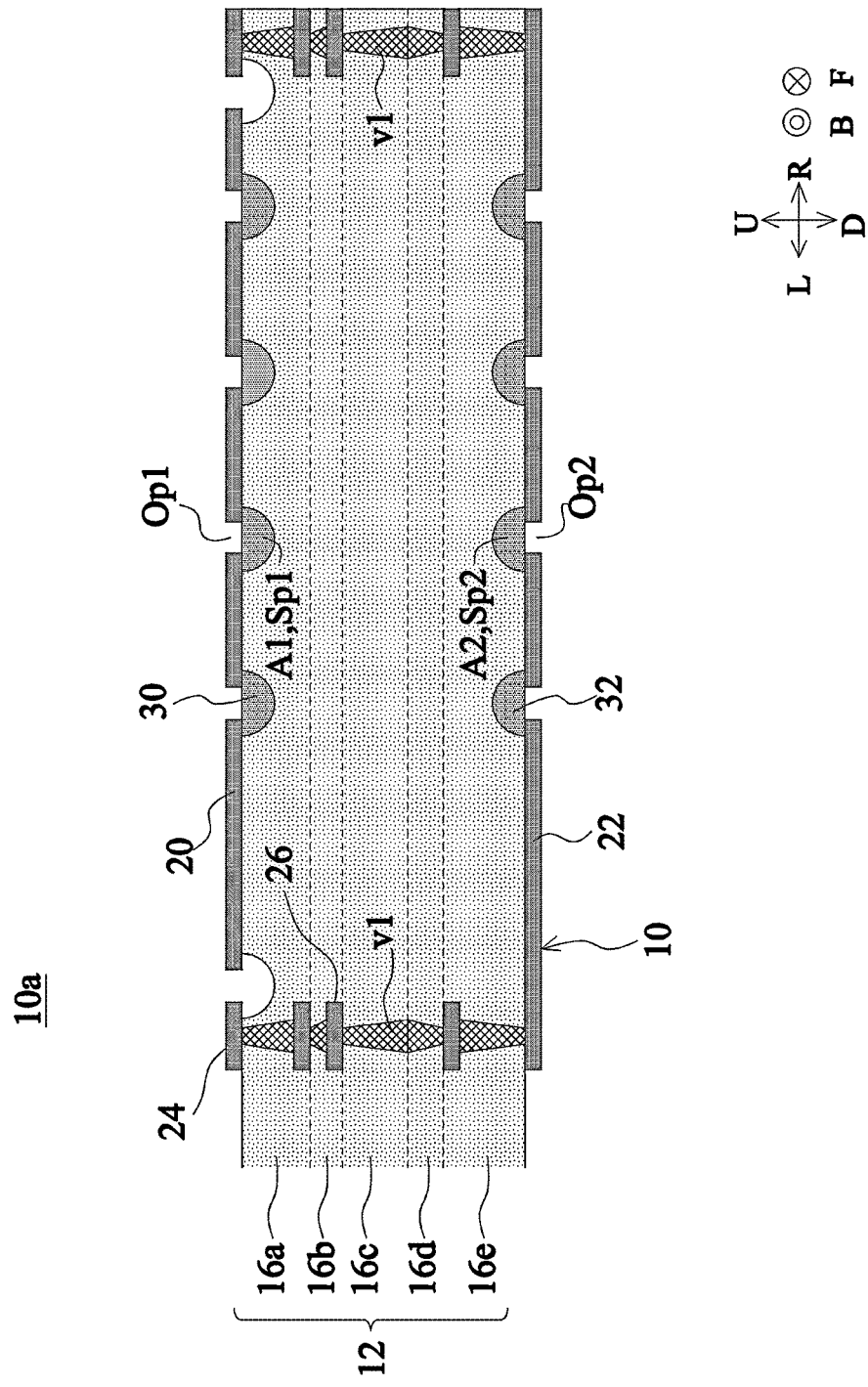
FIG. 4 is a sectional view of an antenna element 10a according to a preferred embodiment of the present invention.

Hereinafter, an antenna element 10a according to a first variant of a preferred embodiment of the present invention is described with reference to the drawings. FIG. 4 is a sectional view of the antenna element 10a.

The antenna element 10a is different from the antenna element 10 in two points below.

A high dielectric constant material 30 having a higher dielectric constant than the dielectric constant of the material of the insulative substrate 12 is provided in the plurality of first insulative substrate non-forming regions A1; and a high dielectric constant material 32 having a higher dielectric constant than the dielectric constant of the material of the insulative substrate 12 is provided in the plurality of second insulative substrate non-forming regions A2.

The high dielectric constant materials 30 and 32 are, for example, materials made by mixing high dielectric ceramic powder into resin. The high dielectric constant material 30 or 32 is not a portion of the insulative substrate 12. Since other structures of the antenna element 10a are the same as or similar to those of the antenna element 10, description thereof is omitted.

Furthermore, a method for manufacturing the antenna element 10a according to a preferred embodiment of the present invention further includes step S6 and step S7 of FIG. 2. In more detail, the plurality of first voids Sp1 are filled with the high dielectric constant material 30 having a higher dielectric constant than the dielectric constant of the material of the insulative substrate 12 (step S6; a first filling step). Furthermore, the plurality of second voids Sp2 are filled with the high dielectric constant material 32 having a higher dielectric constant than the dielectric constant of the material of the insulative substrate 12 (step S7; a second filling step). The first filling step and the second filling step are executed by, for example, pressing, with a squeegee, paste of the high dielectric constant material 30 and paste of the high dielectric constant material 32 into the plurality of first voids Sp1 and the plurality of second voids Sp2. However, a void positioned between the antenna conductor layer 20 and the reference conductor layer 24 is not filled with a high dielectric constant material.

According to the antenna element 10a as described above, the structure enabling high flexibility in design of the frequency of the radio-frequency signal that can be transmitted and received by the antenna element 10a can be obtained. In more detail, when seen in the up-down direction, the outer boundary E1 of each of the plurality of first openings Op1 overlaps a corresponding one of the plurality of first insulative substrate non-forming regions A1 and is not in contact with the insulative substrate 12. In addition, the high dielectric constant material 30 having a higher dielectric constant than the dielectric constant of the material of the insulative substrate 12 is provided in the plurality of first insulative substrate non-forming regions A1. This increases the dielectric constant of the proximity of the antenna conductor layer 20. This reduces the wavelength of the radio-frequency signal to be transmitted through the antenna conductor layer 20. As a result, the frequency of the radio-frequency signal that can be transmitted and received by the antenna element 10a increases. Thus, when the number and the size of the first voids Sp1 are adjusted, the frequency of the radio-frequency signal that can be transmitted and received by the antenna element 10a can be adjusted. From the above description, according to the antenna element 10a, the structure enabling high flexibility in design of the frequency of the radio-frequency signal that can be transmitted and received by the antenna element 10a can be obtained.

Also for the following reason, according to the antenna element 10a, the structure enabling high flexibility in design of the frequency of the radio-frequency signal that can be transmitted and received by the antenna element 10a can be obtained. In more detail, when seen in the up-down direction, the outer boundary E2 of each of the plurality of second openings Op2 overlaps a corresponding one of the plurality of second insulative substrate non-forming regions A2 and is not in contact with the insulative substrate 12. In addition, the high dielectric constant material 32 having a higher dielectric constant than the dielectric constant of the material of the insulative substrate 12 is provided in the plurality of second insulative substrate non-forming regions A2. This increases the dielectric constant between the antenna conductor layer 20 and the reference conductor layer 22. This reduces the wavelength of the radio-frequency signal to be transmitted through the antenna conductor layer 20. As a result, the frequency of the radio-frequency signal that can be transmitted and received by the antenna element 10a increases. Thus, when the number and the size of the second voids Sp2 are adjusted, the frequency of the radio-frequency signal that can be transmitted and received by the antenna element 10a can be adjusted. From the above description, according to the antenna element 10a, the structure allowing high flexibility in design of the frequency of the radio-frequency signal that can be transmitted and received by the antenna element 10a can be obtained.

Meanwhile, in the antenna element 10a, a void portion positioned between the antenna conductor layer 20 and the reference conductor layer 24 is not filled with a high dielectric constant material. This reduces electric field coupling of the antenna conductor layer 20 and the reference conductor layer 24 and improves the radiation efficiency of the antenna conductor layer 20. Furthermore, the size of the antenna conductor layer 20 is reduced.

Furthermore, when the first insulative substrate non-forming regions A1 and the second insulative substrate non-forming regions A2 are filled with the high dielectric constant materials, deformation of the outer boundaries E1 of the first openings Op1 and the outer boundaries E2 of the second opening Op2 is reduced or prevented.

Second Variant

Figure 6:
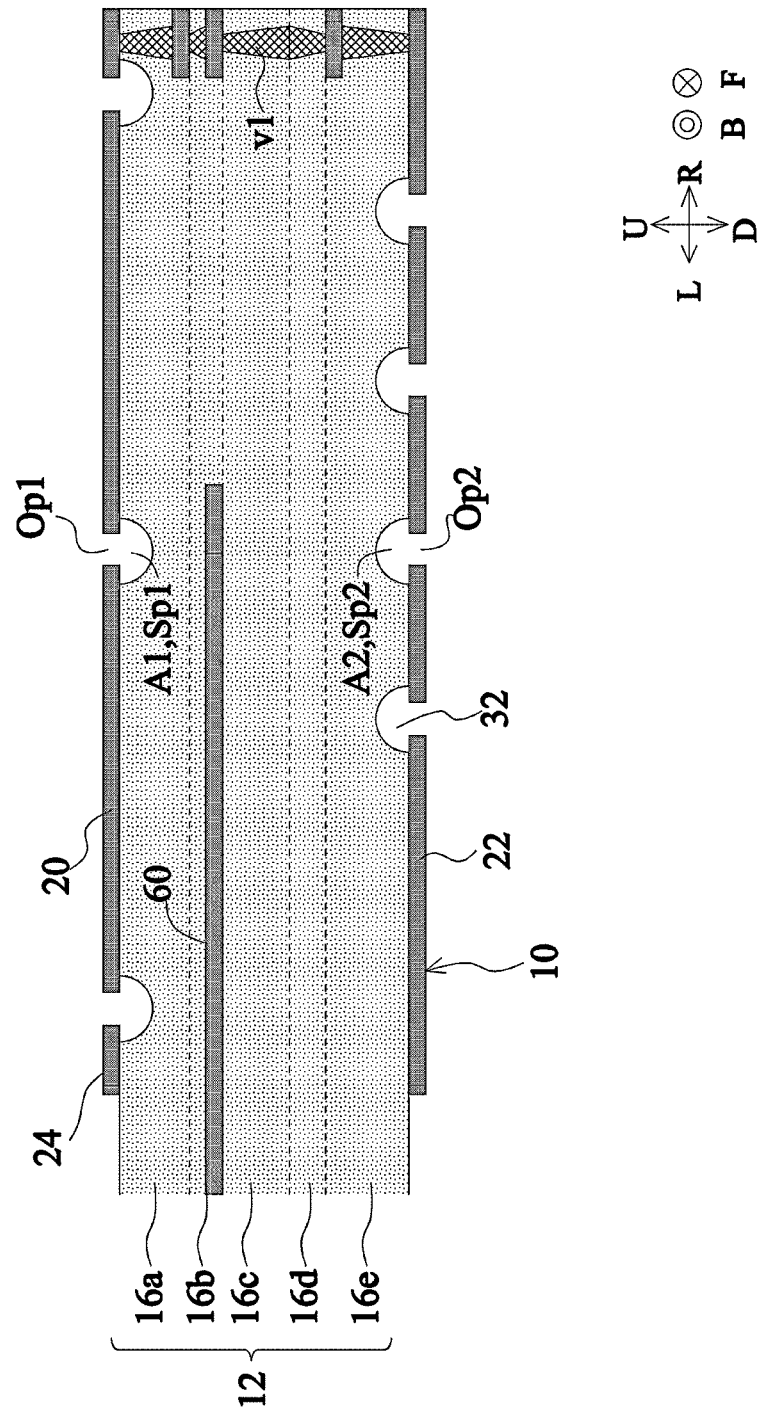
FIG. 6 is a sectional view of the antenna element 10b.

Hereinafter, an antenna element 10b according to a second variant of a preferred embodiment of the present invention is described with reference to the drawings. FIG. 5 is a top view of the insulator layer 16a of the antenna element 10b. FIG. 6 is a sectional view of the antenna element 10b.

The antenna element 10b is different from the antenna element 10 in the number and the shape of the first openings Op1, and the number and the shape of the first insulative substrate non-forming regions A1. In more detail, in the antenna element 10b, the number of the first openings Op1 is one. The number of the first insulative substrate non-forming regions A1 is one. Furthermore, when seen in the up-down direction, the first opening Op1 has a strip shape extending in the front-back direction (a first direction). The length of the first opening Op1 in the front-back direction is about half the wavelength of the radio-frequency signal to be transmitted and received by the antenna conductor layer 20. When seen in the up-down direction, the first insulative substrate non-forming region A1 has a strip shape extending in the front-back direction (the first direction). A signal conductor layer 60 extends in the left-right direction. When seen in the up-down direction, a right end portion of the signal conductor layer 60 is positioned in the proximity of the first opening Op1. In such an antenna element 10b, the antenna conductor layer 20 functions as a slot antenna. Since other structures of the antenna element 10b are similar to those of the antenna element 10, description thereof is omitted. According to the antenna element 10b, the same or substantially the same or substantially the same advantageous operational effects as those of the antenna element 10 can be provided.

Third Variant

Figure 7:
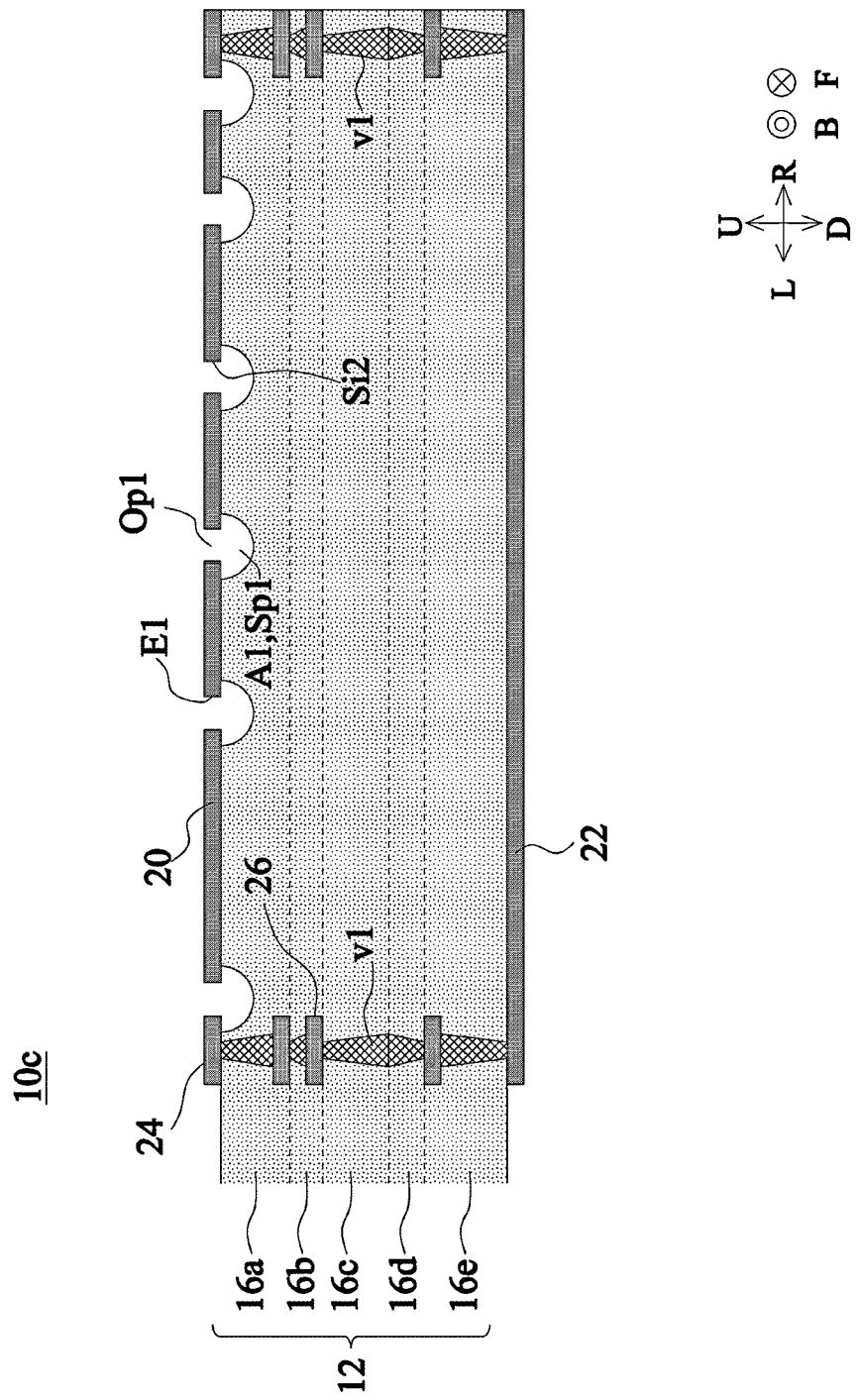
FIG. 7 is a sectional view of an antenna element 10c according to a preferred embodiment of the present invention.

Hereinafter, an antenna element 10c according to a third variant of a preferred embodiment of the present invention is described with reference to the drawings. FIG. 7 is a sectional view of the antenna element 10c.

The antenna element 10c is different from the antenna element 10 in that neither the second openings Op2 nor the second insulative substrate non-forming regions A2 exist in the antenna element 10c. Since other structures of the antenna element 10c are the same as or similar to those of the antenna element 10, description thereof is omitted. The antenna element 10c can produce the same or substantially the same advantageous operational effects as those of the antenna element 10.

Fourth Variant

Figure 8:
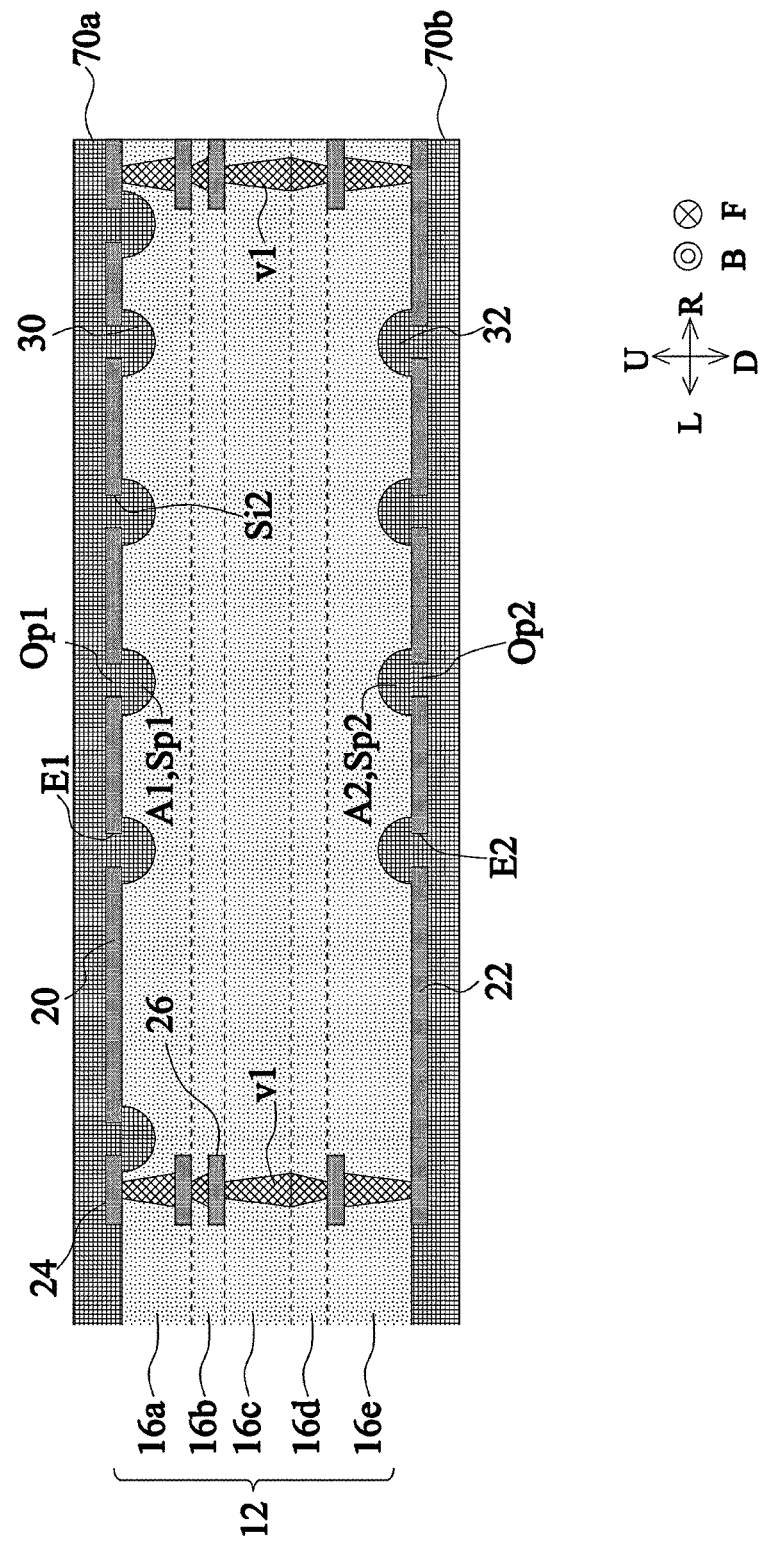
FIG. 8 is a sectional view of an antenna element 10d according to a preferred embodiment of the present invention.

Hereinafter, an antenna element 10d according to a fourth variant of a preferred embodiment of the present invention is described with reference to the drawings. FIG. 8 is a sectional view of the antenna element 10d.

The antenna element 10d is different from the antenna element 10a in that the antenna element 10d further includes a first cover layer 70a and a second cover layer 70b. The first cover layer 70a covers the upper main surface (the first main surface) of the insulative substrate 12. The dielectric constant of the first cover layer 70a is greater than the dielectric constant of the insulative substrate 12. The second cover layer 70b covers the lower main surface (the second main surface) of the insulative substrate 12. The dielectric constant of the second cover layer 70b is greater than the dielectric constant of the insulative substrate 12. Other structures of the antenna element 10d are the same or substantially the same as those of the antenna element 10a. The antenna element 10d can produce the same or substantially the same advantageous operational effects as those of the antenna element 10a.

The first cover layer 70a covers the upper main surface (the first main surface) of the insulative substrate 12. This increases shortening of the wavelength of the radio-frequency signal to be transmitted and received by the antenna conductor layer 20. Furthermore, the antenna conductor layer 20 is protected by the first cover layer 70a. Furthermore, filling of the first insulative substrate non-forming regions A1 and the second insulative substrate non-forming regions A2 with the materials and forming of the first cover layer 70a can be simultaneously performed.

Fifth Variant

Figure 9:
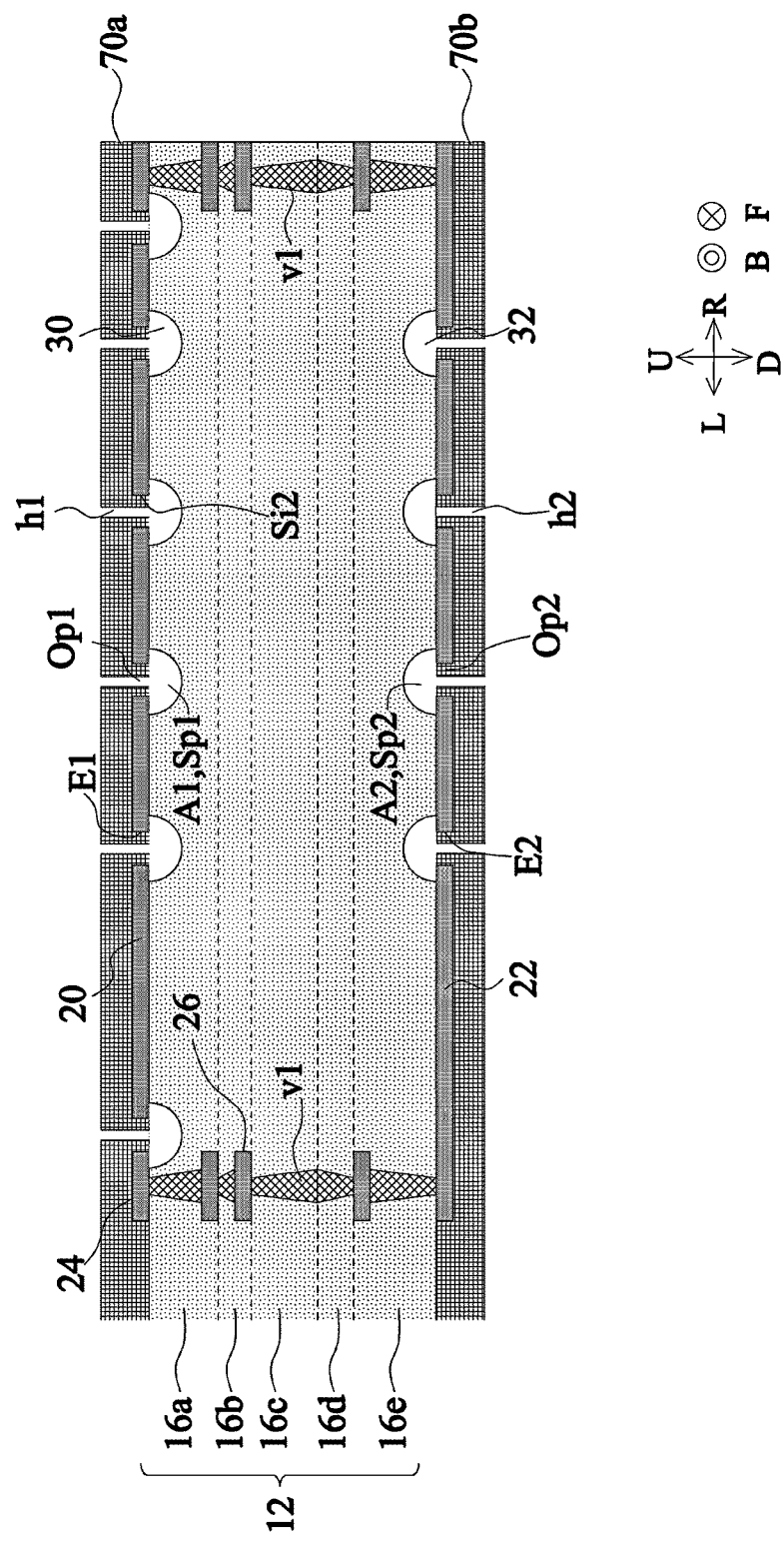
FIG. 9 is a sectional view of an antenna element 10e.

Hereinafter, an antenna element 10e according to a fifth variant of a preferred embodiment of the present invention is described with reference to the drawings. FIG. 9 is a sectional view of the antenna element 10e.

The antenna element 10e is different from the antenna element 10d in that, in the antenna element 10e, a plurality of through holes h1 are provided in the first cover layer 70a and a plurality of through holes h2 are provided in the second cover layer 70b. When seen in the up-down direction, the through holes h1 are provided in portions of the first cover layer 70a that each overlap a corresponding one of one or more first openings Op1. The through holes h1 extend through the first cover layer 70a in the up-down direction. The diameter of the first through holes h1 is smaller than the diameter of the first openings Op1. When seen in the up-down direction, the through holes h2 are provided in portions of the second cover layer 70b that each overlap a corresponding one of one or more second openings Op2. The diameter of the second through holes h2 is smaller than the diameter of the second openings Op2. Other structures of the antenna element 10e are the same as or similar to those of the antenna element 10d. The antenna element 10e can produce the same or substantially the same advantageous operational effects as those of the antenna element 10d.

Since the through holes h1 are provided in the first cover layer 70a, the air can flow into or out of the first voids Sp1. Accordingly, even when the air in the first voids Sp1 expands or contracts due to variations of temperature caused by reflowing or the like, the first cover layer 70 is unlikely to peel off from the insulative substrate 12.

Sixth Variant

Figure 10:
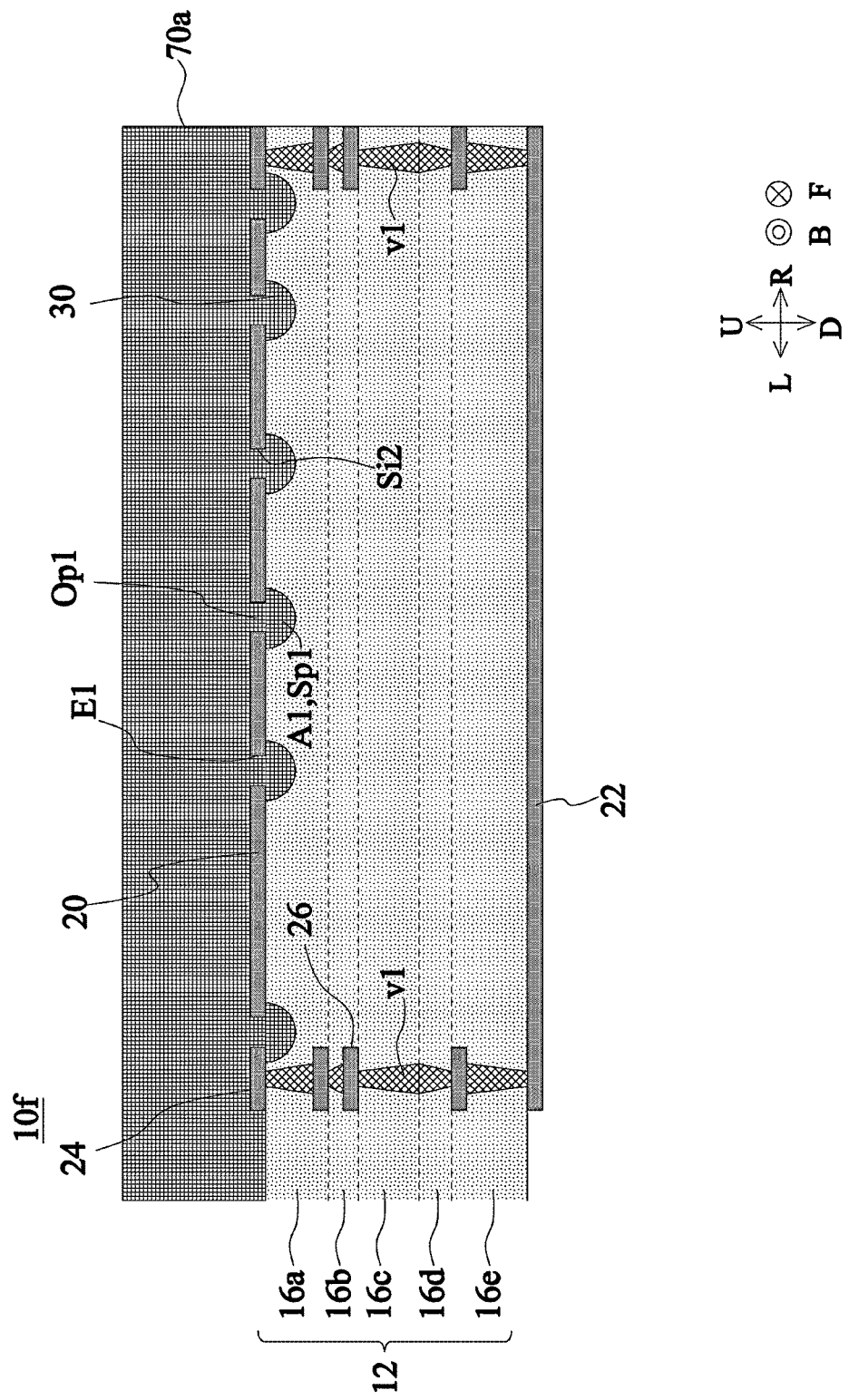
FIG. 10 is a sectional view of an antenna element 10f according to a preferred embodiment of the present invention.

Hereinafter, an antenna element 10f according to a sixth variant of a preferred embodiment of the present invention is described with reference to the drawings. FIG. 10 is a sectional view of the antenna element 10f.

The antenna element 10f is different from the antenna element 10c in that the antenna element 10f further includes the first cover layer 70a. The first cover layer 70a covers the upper main surface (the first main surface) of the insulative substrate 12. The dielectric constant of the first cover layer 70a is greater than the dielectric constant of the insulative substrate 12. Furthermore, the thickness of the first cover layer 70a of the antenna element 10f in the up-down direction is greater than the thickness of the first cover layer 70a of the antenna element 10d in the up-down direction. Other structures of the antenna element 10f are the same as or similar to those of the antenna element 10c. The antenna element 10f can produce the same or substantially the same advantageous operational effects as those of the antenna element 10c.

The first cover layer 70a covers the upper main surface (the first main surface) of the insulative substrate 12. This increases an advantageous effect of shortening the wavelength of the radio-frequency signal to be transmitted and received by the antenna conductor layer 20. Furthermore, the antenna conductor layer 20 is protected by the first cover layer 70a. Furthermore, filling of the first insulative substrate non-forming regions A1 and the second insulative substrate non-forming regions A2 with the materials and forming of the first cover layer 70a can be simultaneously performed.

Seventh Variant

Figure 11:
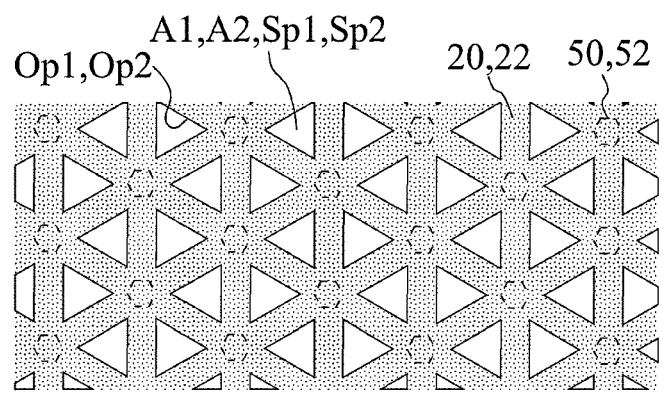
FIG. 11 is a top view of the insulator layer 16a of an antenna element 10g according to a preferred embodiment of the present invention and a bottom view of an insulator layer 16e of the antenna element 10g.

Hereinafter, an antenna element 10g according to a seventh variant of a preferred embodiment of the present invention is described with reference to the drawings. FIG. 11 is a top view of the insulator layer 16a of the antenna element 10g and a bottom view of the insulator layer 16e of the antenna element 10g.

The antenna element 10g is different from the antenna element 10 in that the antenna conductor layer 20 and the reference conductor layer 22 have a mesh structure. In more detail, the plurality of first openings Op1 are provided in the antenna conductor layer 20. The plurality of first openings Op1 have a regular or substantially regular triangular shape. The plurality of first insulative substrate non-forming regions A1 are provided in the insulative substrate 12. The plurality of first insulative substrate non-forming regions A1 are connected to each other, thus providing a plurality of first pillar portions 50 in the insulative substrate 12. The plurality of first pillar portions 50 extend in the up-down direction, and, when seen in the up-down direction, are surrounded by the plurality of first insulative substrate non-forming regions A1.

The plurality of second openings Op2 are provided in the reference conductor layer 22. The plurality of second openings Op2 have a regular or substantially regular triangular shape. The plurality of second insulative substrate non-forming regions A2 are provided in the insulative substrate 12. The plurality of second insulative substrate non-forming regions A2 are connected to each other, thus providing a plurality of second pillar portions 52 in the insulative substrate 12. The plurality of second pillar portions 52 extend in the up-down direction, and, when seen in the up-down direction, are surrounded by the plurality of second insulative substrate non-forming regions A2. Since other structures of the antenna element 10g are the same as or similar to those of the antenna element 10, description thereof is omitted. The antenna element 10g produces the same or substantially the same advantageous operational effects as those of the antenna element 10.

Eighth Variant

Figure 12:
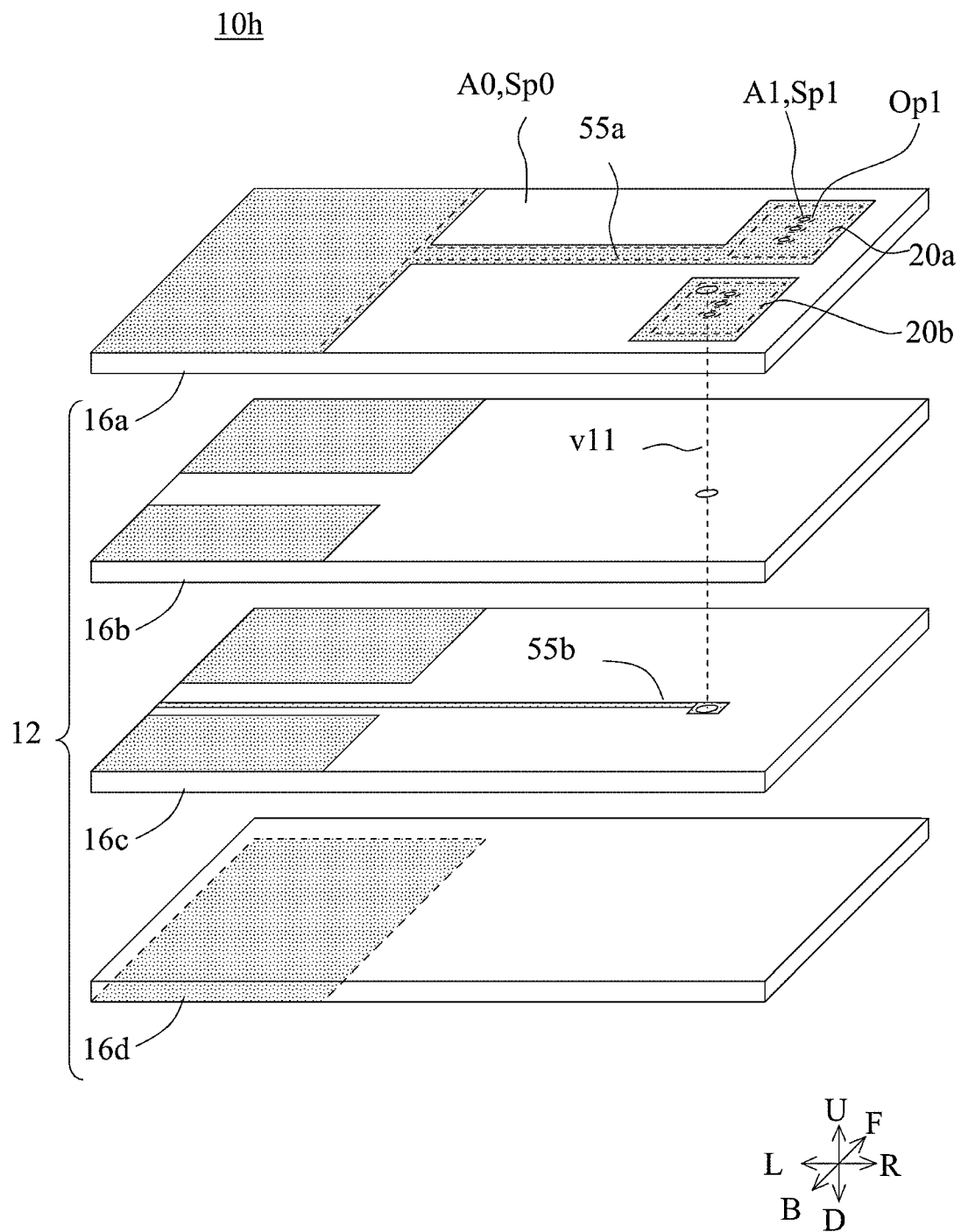
FIG. 12 is an exploded perspective view of an antenna element 10h according to a preferred embodiment of the present invention.

Hereinafter, an antenna element 10h according to an eighth variant of a preferred embodiment of the present invention is described with reference to the drawings. FIG. 12 is an exploded perspective view of the antenna element 10h.

The antenna element 10h is different from the antenna element 10 in that antenna conductor layers 20a and 20b define a dipole antenna. Accordingly, the antenna element 10h does not include the reference conductor layer 22. Each of the antenna conductor layers 20a and 20b is provided on the upper main surface of the insulator layer 16a. The antenna conductor layers 20a and 20b have a strip shape extending in the front-back direction. A signal conductor layer 55a is connected to the antenna conductor layer 20a. A signal conductor layer 55b is connected to the antenna conductor layer 20b via an interlayer connection conductor v11.

The plurality of first openings Op1 are provided in each of the antenna conductor layers 20a and 20b. Furthermore, the plurality of first insulative substrate non-forming regions A1 are provided in the insulator layer 16a. Since other structures of the antenna element 10h are the same as or similar to those of the antenna element 10, description thereof is omitted. The antenna element 10h can produce the same or substantially the same advantageous operational effects as those of the antenna element 10.

Circuit Board

Figure 13:
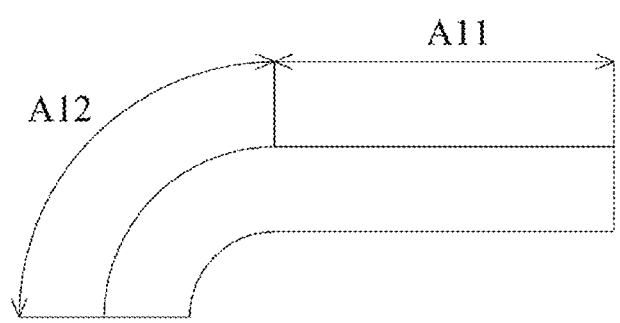
FIG. 13 is a back view of a circuit board 200 according to a preferred embodiment of the present invention.

Hereinafter, a circuit board 200 according to a preferred embodiment of the present invention is described with reference to the drawings. FIG. 13 is a back view of the circuit board 200.

The circuit board 200 includes a first section A11 and a second section A12. The antenna conductor layer 20 is provided in the first section A11. That is, the first section A11 has the same or substantially the same structure as that of the antenna elements 10, 10a to 10h. The antenna conductor layer 20 is not provided in the second section A12. However, a signal conductor layer electrically connected to the antenna conductor layer 20 is provided. The first section A11 is not curved. The second section A12 is curved. However, the first section A11 may be curved. In this case, the radius of curvature of the first section A11 is greater than the radius of curvature of the second section A12.

Other Variants

Hereinafter, voids Sp1a to Sp1f of the antenna element according to other variants of preferred embodiments of the present invention are described with reference to the drawings. FIGS. 14 to 20 are respectively sectional views of the voids Sp1a to Sp1g.

As illustrated in FIG. 14, a portion of the void Sp1a where the width in a direction perpendicular or substantially perpendicular to the up-down direction is maximum may be positioned below the upper main surface of the insulator layer 16a. Alternatively, as illustrated in FIG. 15, the void Sp1b may have an inverted conical shape. Alternatively, as illustrated in FIG. 16, the void Sp1c may have an inverted frusto-conical shape. Alternatively, as illustrated in FIG. 17, the void Sp1d may include a plurality of insulator layers 16a and 16b. Alternatively, as illustrated FIG. 18, the void Sp1e may extend through in the up-down direction between the upper main surface of the insulator layer 16a and the lower main surface of the insulator layer 16d.

Alternatively, as illustrated in FIG. 19, an insulator layer 116a may be provided between the insulator layer 16a and the insulator layer 16b. The material of the insulator layer 116a is, for example, fluoroplastic. Accordingly, compared to the insulator layer 16a, the insulator layer 116a is unlikely to be removed by the etching. Accordingly, the void Sp1f extends only through the insulator layer 16a in the up-down direction. Alternatively, as illustrated in FIG. 20, a through hole H120 may be provided in the insulator layer 116a. In this case, the void Sp1g is provided in the insulator layer 16a and the insulator layer 16b. Alternatively, instead of the insulator layer 116a illustrated in FIG. 19 or FIG. 20, an electrical conductor layer not to be etched may be provided.

Other Preferred Embodiments

The antenna element according to the present invention is not limited to the antenna elements 10 and 10a to 10g according to preferred embodiments of the present invention and variants thereof. The antenna element according to the present invention can be changed without departing from the scope of the present invention. The configurations of the antenna elements 10 and 10a to 10g may be arbitrarily combined with each other.

The method for manufacturing the antenna element according to the present invention is not limited to the method for manufacturing the antenna elements 10 and 10a to 10g according to preferred embodiments of the present invention and variants thereof. The antenna element according to the present invention can be changed without departing from the scope of the present invention. The individual steps of the method for manufacturing the antenna elements 10 and 10a to 10g may be arbitrarily combined with each other.

In the antenna element 10a, a low dielectric constant material having a lower dielectric constant than the dielectric constant of the material of the insulative substrate 12 may be provided in the plurality of first insulative substrate non-forming regions A1. A low dielectric constant material having a lower dielectric constant than the dielectric constant of the material of the insulative substrate 12 may be provided in the plurality of second insulative substrate non-forming regions A2.

In the antenna elements 10, 10a to 10g, an insulator layer may be provided above the antenna conductor layer 20. This insulator layer is not a portion of the insulative substrate 12. In the antenna elements 10, 10a to 10g, an insulator layer may be provided below the reference conductor layer 22. This insulator layer is not a portion of the insulative substrate 12.

It is sufficient that, in the antenna elements 10, 10a, and 10g, the number of the first openings Op1, the number of the second openings Op2, the number of the first insulative substrate non-forming regions A1, the number of the second insulative substrate non-forming regions A2, the number of the first voids Sp1, and the number of the second voids Sp2 are one or more.

In the antenna elements 10, 10a to 10g, the reference conductor layer 22, 24, or 26 is not necessary provided.

In the antenna elements 10, 10a to 10g, the first openings Op1, the first insulative substrate non-forming regions A1, or the first voids Sp1 are not necessarily provided.

In the antenna elements 10, 10a to 10g, the second openings Op2, the second insulative substrate non-forming regions A2, or the second voids Sp2 are not necessarily provided.

In the antenna elements 10 and 10a to 10g, the insulative substrate 12 does not necessarily have flexibility. The material of the insulative substrate 12 may be a material other than, for example, thermoplastic resin.

In the antenna elements 10 and 10a to 10g, the insulator layers 16a to 16e may be joined together with bond layers the material of which is different from the material of the insulator layers 16a to 16e.

In the method for manufacturing the antenna element 10, the pressure bonding step may be performed after the first void forming step and the second void forming step have been performed.

In the antenna elements 10 and 10a to 10g, a portion at which the antenna conductor layer 20 is provided may be bent or a line portion may be bent.

The dielectric constant of the first cover layer 70a and the dielectric constant of the second cover layer 70b may be smaller than the dielectric constant of the insulative substrate 12.

A layer of the same material as the material of the insulator layers 16a to 16d may be laminated on the upper main surface of the insulative substrate 12. In this case, this layer is not a portion of the insulative substrate 12. That is, the layer laminated above the upper main surface of the insulative substrate 12 where the antenna conductor layer 20 is provided is not a portion of the insulative substrate 12.

In the antenna element 10d, the material with which the first insulative substrate non-forming regions A1 and the second insulative substrate non-forming regions A2 are filled may be different from the material of the first cover layer 70a and the material of the second cover layer 70b.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna element, comprising:
an insulative substrate including a first main surface and a second main surface arranged in an up-down direction; and
an antenna conductor layer on the first main surface of the insulative substrate; wherein
one or more first openings including, when seen in the up-down direction, respective annular outer boundaries are provided in the antenna conductor layer;
one or more first insulative substrate non-forming regions are positioned between the insulative substrate and the antenna conductor layer in the up-down direction;
the insulative substrate does not exist in the one or more first insulative substrate non-forming regions;
the outer boundaries of the one or more first openings respectively overlap, when seen in the up-down direction, the one or more first insulative substrate non-forming regions and are not in contact with the insulative substrate; and
the antenna element includes a structure in which the one or more first insulative substrate non-forming regions are first voids, or a structure in which a low dielectric constant material having a lower dielectric constant than a dielectric constant of a material of the insulative substrate or a high dielectric constant material having a higher dielectric constant than the dielectric constant of the material of the insulative substrate is provided in the one or more first insulative substrate non-forming regions.

2. The antenna element according to claim 1, wherein
a plurality of the first insulative substrate non-forming regions are positioned between the insulative substrate and the antenna conductor layer in the up-down direction;
the plurality of first insulative substrate non-forming regions are connected to each other to provide a plurality of first pillar portions in the insulative substrate; and
the plurality of first pillar portions extend in the up-down direction and, when seen in the up-down direction, are surrounded by the plurality of first insulative substrate non-forming regions.

3. The antenna element according to claim 1, wherein,
when seen in the up-down direction, the first openings have a strip shape extending in a first direction; and
the antenna conductor layer defines and functions as a slot antenna.

4. An antenna element, comprising:
an insulative substrate including a first main surface and a second main surface arranged in an up-down direction;
an antenna conductor layer on the first main surface of the insulative substrate; and
a reference conductor layer on the second main surface of the insulative substrate; wherein
when seen in the up-down direction, the reference conductor layer overlaps the antenna conductor layer;
one or more second openings that include, when seen in the up-down direction, respective annular outer boundaries are provided in the reference conductor layer;
one or more second insulative substrate non-forming regions are positioned between the insulative substrate and the reference conductor layer in the up-down direction;
the insulative substrate does not exist in the one or more second insulative substrate non-forming regions;
the outer boundaries of the one or more second openings respectively overlap, when seen in the up-down direction, the one or more second insulative substrate non-forming regions and are not in contact with the insulative substrate; and
the antenna element includes a structure in which the one or more second insulative substrate non-forming regions are second voids, or a structure in which a low dielectric constant material having a lower dielectric constant than a dielectric constant of a material of the insulative substrate or a high dielectric constant material having a higher dielectric constant than the dielectric constant of the material of the insulative substrate is provided in the one or more second insulative substrate non-forming regions.

5. The antenna element according to claim 4, wherein
a plurality of the second openings are provided in the reference conductor layer;
a plurality of first insulative substrate non-forming regions are positioned between the insulative substrate and the reference conductor layer in the up-down direction;
a plurality of second insulative substrate non-forming regions are connected to each other to provide a plurality of second pillar portions in the insulative substrate; and
the plurality of second pillar portions extend in the up-down direction and, when seen in the up-down direction, are surrounded by the plurality of second insulative substrate non-forming regions.

6. The antenna element according to claim 1, wherein a material of the insulative substrate is thermoplastic resin.

7. The antenna element according to claim 1, wherein
a plurality of the first openings are provided in the antenna conductor layer; and
a distance between the plurality of first openings adjacent to each other is smaller than or equal to one quarter of a wavelength of a radio-frequency signal to be transmitted and received by the antenna conductor layer.

8. The antenna element according to claim 1, further comprising a first cover layer that covers the first main surface of the insulative substrate.

9. The antenna element according to claim 8, wherein a dielectric constant of the first cover layer is greater than a dielectric constant of the insulative substrate.

10. The antenna element according to claim 8, wherein a dielectric constant of the first cover layer is smaller than a dielectric constant of the insulative substrate.

11. The antenna element according to claim 8, wherein through holes are provided in portions of the first cover layer that overlap the one or more first openings when seen in the up-down direction.

12. The antenna element according to claim 1, further comprising a second cover layer that covers the second main surface of the insulative substrate.

13. An electronic device, comprising:
the antenna element according to claim 1.

14. A method for manufacturing an antenna element, the method comprising:
   forming an antenna conductor layer to form, on a first insulator layer, in which one or more first openings including, when seen in an up-down direction, respective annular outer boundaries are provided;
   performing pressure bonding to form an insulative substrate by pressure bonding a plurality of insulator layers including a first insulator layer; and
   performing first void forming to form one or more first voids that respectively include, when seen in the up-down direction, the one or more first openings by performing etching on the first insulator layer with the antenna conductor layer used as a mask.

15. The method for manufacturing an antenna element according to claim 14, the method further comprising:
   performing first filling to fill the one or more first voids with a low dielectric constant material having a lower dielectric constant than a dielectric constant of a material of the insulative substrate or a high dielectric constant material having a higher dielectric constant than the dielectric constant of the material of the insulative substrate.

16. A method for manufacturing an antenna element, the method comprising:
   forming a reference conductor layer to form, on a second insulator layer, in which one or more second openings including, when seen in an up-down direction, respective annular outer boundaries are provided;
   performing pressure bonding to form an insulative substrate by pressure bonding a plurality of insulator layers including a first insulator layer on which an antenna conductor layer is provided and the second insulator layer; and
   performing second void forming to form one or more second voids respectively including, when seen in the up-down direction, the one or more second openings by performing etching on the second insulator layer with the reference conductor layer used as a mask.

17. The method for manufacturing an antenna element according to claim 16, the method further comprising:
   performing filling to fill the one or more second voids with a low dielectric constant material having a lower dielectric constant than a dielectric constant of a material of the insulative substrate or a high dielectric constant material having a higher dielectric constant than the dielectric constant of the material of the insulative substrate.

18. The antenna element according to claim 4, wherein a material of the insulative substrate is thermoplastic resin.

19. The antenna element according to claim 4, further comprising a first cover layer that covers the first main surface of the insulative substrate.

20. The antenna element according to claim 19, wherein a dielectric constant of the first cover layer is greater than a dielectric constant of the insulative substrate.

* * * * *